United States Patent
Kim

(10) Patent No.: US 9,502,740 B2
(45) Date of Patent: Nov. 22, 2016

(54) THERMAL MANAGEMENT IN ELECTRONIC APPARATUS WITH PHASE-CHANGE MATERIAL AND SILICON HEAT SINK

(71) Applicant: Gerald Ho Kim, Fallbrook, CA (US)

(72) Inventor: Gerald Ho Kim, Fallbrook, CA (US)

( * ) Notice: Subject to any disclaimer, the term of this patent is extended or adjusted under 35 U.S.C. 154(b) by 0 days.

(21) Appl. No.: 14/987,744

(22) Filed: Jan. 4, 2016

(65) Prior Publication Data
US 2016/0118699 A1 Apr. 28, 2016

Related U.S. Application Data

(63) Continuation-in-part of application No. 14/507,794, filed on Oct. 6, 2014, now Pat. No. 9,230,879.

(60) Provisional application No. 61/926,363, filed on Jan. 12, 2014, provisional application No. 61/938,157, filed on Feb. 11, 2014.

(51) Int. Cl.
*H01L 23/427* (2006.01)
*H01L 23/04* (2006.01)
*H01L 23/367* (2006.01)
*H01L 23/373* (2006.01)
*H01M 10/6551* (2014.01)
*H01M 10/6569* (2014.01)
*H01L 23/00* (2006.01)

(52) U.S. Cl.
CPC .......... *H01M 10/6551* (2015.04); *H01L 23/04* (2013.01); *H01L 23/3738* (2013.01); *H01L 23/4275* (2013.01); *H01M 10/6569* (2015.04); *H01L 24/29* (2013.01); *H01L 24/32* (2013.01); *H01L 2224/291* (2013.01); *H01L 2224/2919* (2013.01); *H01L 2224/32225* (2013.01); *H01L 2924/12042* (2013.01); *H01L 2924/12044* (2013.01); *H01L 2924/1432* (2013.01); *H01L 2924/1434* (2013.01); *H01M 2220/20* (2013.01)

(58) Field of Classification Search
CPC .......... H01L 23/3738; H01L 23/4275; H01L 24/29; H01L 23/32
USPC ....... 257/675, 712, 713, 701, 714, 717, 720, 257/719, 721, 722
See application file for complete search history.

(56) References Cited

U.S. PATENT DOCUMENTS

2005/0201062 A1* 9/2005 Matteson ................ H01L 23/42
361/704

* cited by examiner

*Primary Examiner* — Alexander Oscar Williams
(74) *Attorney, Agent, or Firm* — Andy M. Han

(57) ABSTRACT

Embodiments of an apparatus with a thermal management technique utilizing a silicon heat sink and/or a phase-change material, as well as an assembling method thereof, are described. In one aspect, the apparatus comprises a main unit, a phase-change material and an enclosure enclosing the main unit and the phase-change material. The main unit comprises a substrate and at least one heat-generating device disposed on the substrate. The phase-change material is in direct contact with each heat-generating device of the at least one heat-generating device to absorb and dissipate heat generated by the at least one heat-generating device.

19 Claims, 19 Drawing Sheets

THERMAL MANAGEMENT IN ELECTRONIC APPARATUS WITH PHASE-CHANGE MATERIAL AND SILICON HEAT SINK

CROSS REFERENCE TO RELATED PATENT APPLICATIONS

The present disclosure is a continuation-in-part (CIP) application of U.S. patent application Ser. No. 14/507,794, filed on 6 Oct. 2014 and claiming the priority benefit of two provisional patent applications, U.S. Patent Application No. 61/926,363 filed on 12 Jan. 2014 and U.S. Patent Application No. 61/938,157 filed on 11 Feb. 2014. The aforementioned applications are incorporated by reference in their entirety.

TECHNICAL FIELD

The present disclosure generally relates to the field of transfer of thermal energy and, more particularly, to thermal management in an apparatus.

BACKGROUND

Unless otherwise indicated herein, the approaches described in this section are not prior art to the claims in this application and are not admitted to be prior art by inclusion in this section.

Compact heat-generating devices, such as integrated-circuits (including microprocessors, graphics chips, radio frequency (RF) chips, networking communication chips, microwave chips, etc.), laser diodes, light-emitting diodes (LEDs), vertical-cavity surface emitting lasers (VCSELs), batteries, electronic modules, optical modules, electro-optical modules, RF modules, electro-chemical modules, mechanical modules and the like, generate thermal energy, or heat, when in operation. Compact heat-generating devices may function as, for example, sensors or ASIC drivers in a telecom router, cellular phone tower, data communications server or mainframe computers. Regardless of which type of heat-generating device the case may be, heat generated by a compact heat-generating device needs to be removed or dissipated from the compact heat-generating device in order to achieve optimum performance of the compact heat-generating device by keeping its temperature within a safe operating range. With the form factor of compact heat-generating devices and the applications they are implemented in becoming ever smaller (e.g., the processor in a smartphone, a tablet computer or a notebook computer) and thus resulting in high heat density, it is imperative to effectively dissipate the high-density heat generated in an area of a small footprint to ensure safe and optimum operation of compact heat-generating devices operating under such conditions.

Many metal-based water-cooled and air-cooled cooling packages have been developed for use in compact packages to dissipate heat generated by the various types of compact heat-generating devices mentioned above. For instance, heat exchangers and heat pipes made of a metallic material with high thermal conductivity, such as copper, silver, aluminum or iron, are commercially available. However, most metal-based heat exchangers and heat pipes experience issues of oxidation, corrosion and/or crystallization after long periods of operation. Such fouling factors significantly reduce the heat transfer efficiency of metal-based heat exchangers and heat pipes. Other problems associated with the use of metal-based cooling packages include, for example, issues with overall compactness of the package, corrosion of the metallic material in water-cooled applications, difficulty in manufacturing, and so on. With increasing demand for high power density in small form factor, there is a need for a compact cooling package for compact heat-generating devices with fewer or none of the aforementioned issues.

One issue with heat dissipation in portable/mobile applications is that, even when heat generated by a compact heat-generating device (e.g., the processor in a smartphone, a tablet computer or a notebook computer) is removed or otherwise transferred away from the compact heat-generating device itself, this thermal energy is transferred to other portions of a portable/mobile electronics apparatus in which the compact heat-generating device is enclosed. This may be undesirable especially in portable/mobile applications. For instance, at least a portion of the heat generated by a microprocessor in a smartphone or tablet computer is transferred to the enclosure of the smartphone or tablet computer (e.g., a portion of the apparatus's enclosure closest to the microprocessor), thus making at least a portion of the enclosure warm or even hot to touch. As another example, some notebook computers may have a cooling fan installed therein to promote heat transfer by convection to cool off the microprocessor of the notebook computer. Still, warm air can be felt near a vent of the enclosure where the cooling fan blows hot air out of the enclosure, and at least a portion of the enclosure of the notebook computer may still be warm or even hot to touch. Consequently, user experience of such portable/mobile electronics apparatus may be negatively impacted if not rendered harmful.

SUMMARY

Various embodiments of thermal management in an apparatus with a phase-change material and, optionally, one or more silicon heat sinks are provided. Embodiments of a method of assembling the apparatus are also provided.

In one aspect, a thermal management package may include a main unit, a phase-change material, and an enclosure that encloses the main unit and the phase-change material therein. The main unit may include a substrate and at least one heat-generating device (e.g., integrated-circuit (IC) chip or battery) disposed on the substrate. The phase-change material may be in direct contact with each heat-generating device of the at least one heat-generating device and configured to absorb at least a portion of heat generated by the at least one heat-generating device during operation of the at least one heat-generating device.

In some embodiments, the phase-change material may surround the at least one heat-generating device and may be in direct contact with the at least one heat-generating device and the enclosure.

In some embodiments, the phase-change material may substantially fill a void between the main unit and the enclosure.

In some embodiments, the phase-change material may include a salt hydrate, an ionic liquid, paraffin, fatty acid, ester, an organic-organic compound, an organic-inorganic compound, or an inorganic-inorganic compound.

In some embodiments, the thermal management package may further include at least one silicon heat sink. Each silicon heat sink of the at least one silicon heat sink may include a base portion and a fin portion. The fin portion may include a plurality of fins protruding from the base portion.

In some embodiments, the at least one silicon heat sink may include one or more heat sinks made of single-crystal silicon.

In some embodiments, the at least one silicon heat sink may include a first silicon heat sink corresponding to and disposed on a first heat-generating device of the at least one heat-generating device.

Additionally, the at least one silicon heat sink may further include at least one additional silicon heat sink disposed on the enclosure.

In some embodiments, the at least one additional silicon heat sink may be disposed on an inner side of the enclosure facing a side of the substrate on which the at least one heat-generating device is disposed. The fins of the first silicon heat sink may protrude from the base portion thereof in a first direction and the fins of the at least one additional silicon heat sink may protrude from the base portion thereof in a second direction opposite to the first direction.

In some embodiments, the at least one additional silicon heat sink may be aligned with the first silicon heat sink.

In some embodiments, at least one of the fins of the first silicon heat sink may be disposed between respective two adjacent fins of the at least one additional silicon heat sink, and at least one of the fins of the at least one additional silicon heat sink may be disposed between respective two adjacent fins of the first silicon heat sink.

In some embodiments, at least a portion of the enclosure may be made of metal or plastic.

In some embodiments, the substrate may include a printed circuit board (PCB), and the at least one heat-generating device may include a processor chip or a battery.

In some embodiments, the enclosure may include a first primary side and a second primary side. The first primary side of the enclosure may include an interface unit coupled to the processor chip and configured to display information to a user or function as an input/output (I/O) interface that provides information to the user and receives input from the user.

In some embodiments, at least a layer of the interface unit may be made of glass or sapphire.

In another aspect, a method of assembling a thermal management package may include: disposing at least one heat-generating device and one or more electronic components on a substrate to form a main unit; disposing the main unit in an enclosure; and disposing a phase-change material in the enclosure.

In some embodiments, disposing the phase-change material in the enclosure may include injecting the phase-change material in a liquid phase into the enclosure such that the phase-change material surrounds the at least one heat-generating device and may be in direct contact with the at least one heat-generating device and the enclosure.

In some embodiments, injecting the phase-change material in a liquid phase into the enclosure may include substantially filling a void between the main unit and the enclosure with the phase-change material.

In some embodiments, the phase-change material may include a salt hydrate, an ionic liquid, paraffin, fatty acid, ester, an organic-organic compound, an organic-inorganic compound, or an inorganic-inorganic compound.

In some embodiments, the method may further include disposing at least one silicon heat sink on the at least one heat-generating device. Each silicon heat sink of the at least one silicon heat sink may include a base portion and a fin portion. The fin portion may include a plurality of fins protruding from the base portion.

In some embodiments, the at least one silicon heat sink may include one or more heat sinks made of single-crystal silicon.

In some embodiments, disposing the at least one silicon heat sink on the at least one heat-generating device may include disposing a first silicon heat sink of the at least one silicon heat sink on a first heat-generating device of the at least one heat-generating device.

In some embodiments, the method may further include disposing at least one additional silicon heat sink of the at least one silicon heat sink on the enclosure.

In some embodiments, disposing the at least one additional silicon heat sink on the enclosure may include bonding, by thermally-conductive epoxy or solder, the at least one additional silicon heat sink on an inner side of the enclosure facing a side of the substrate on which the at least one heat-generating device is disposed. The fins of the first silicon heat sink may protrude from the base portion thereof in a first direction and the fins of the at least one additional silicon heat sink may protrude from the base portion thereof in a second direction opposite to the first direction.

In some embodiments, the at least one additional silicon heat sink may be aligned with the first silicon heat sink.

In some embodiments, at least one of the fins of the first silicon heat sink may be disposed between respective two adjacent fins of the at least one additional silicon heat sink, and at least one of the fins of the at least one additional silicon heat sink may be disposed between respective two adjacent fins of the first silicon heat sink.

In some embodiments, at least a portion of the enclosure may be made of metal or plastic.

In some embodiments, the substrate may include a PCB, and the at least one heat-generating device may include a processor chip.

In some embodiments, the enclosure may include a first primary side and a second primary side. The first primary side of the enclosure may include an interface unit coupled to the processor chip and configured to display information to a user or function as an I/O interface that provides information to the user and receives input from the user.

In some embodiments, at least a layer of the interface unit may be made of glass or sapphire.

In still another aspect, a thermal management package may include a main unit, a thermal management unit, and an enclosure that encloses the main unit and the thermal management unit therein. The main unit may include a substrate and at least one heat-generating device disposed on the substrate. The thermal management unit may include a silicon heat sink, a phase-change material, and a container. The silicon heat sink may be coupled to the at least one heat-generating device and may include a base portion and a fin portion. The fin portion may include a plurality of fins protruding from the base portion. The phase-change material may be in direct contact with at least the fin portion of the silicon heat sink and configured to absorb at least a portion of heat that is generated by the at least one heat-generating device and transferred through the silicon heat sink. The container may be coupled to the silicon heat sink and configured to contain the phase-change material therein.

In some embodiments, the phase-change material may include a salt hydrate, an ionic liquid, paraffin, fatty acid, ester, an organic-organic compound, an organic-inorganic compound, or an inorganic-inorganic compound.

In some embodiments, the silicon heat sink may be made of single-crystal silicon.

In some embodiments, the silicon heat sink may further include walls around a periphery of the base portion such that the fin portion is surrounded by the walls.

In some embodiments, the container may include a silicon cover disposed on the silicon heat sink. The silicon cover may have a first primary side and a second primary side with the first primary side including an indentation and facing the silicon heat sink when disposed thereon.

In some embodiments, the silicon cover may be made of single-crystal silicon.

In some embodiments, the silicon cover may be disposed between the silicon heat sink and the enclosure and may be in direct contact with the enclosure.

In some embodiments, the phase-change material may be contained within a space between the silicon cover and the silicon heat sink.

In some embodiments, the thermal management package may further include an additional silicon heat sink disposed on the second primary side of the silicon cover.

In some embodiments, the container may be expandable and configured to expand as at least a portion of the phase-change material changes from a first phase to a second phase in response to absorbing the heat generated by the at least one heat-generating device.

In some embodiments, the container may be not in direct contact with the enclosure when the phase-change material is in the first phase. The container may expand to be in direct contact with the enclosure when the at least a portion of the phase-change material is in the second phase.

In some embodiments, the container may include a pouch having an opening such that, when the container is coupled to the silicon heat sink, at least a portion of the base portion of the silicon heat sink is exposed. The exposed portion of the silicon heat sink may be in direct contact with the at least one heat-generating device.

In some embodiments, the pouch may be coupled to the silicon heat sink by heat and pressure, solder, pressure-sensitive adhesive, or epoxy.

In some embodiments, the container may include a pouch that includes a metallic foil.

In some embodiments, the container may include a pouch that includes an aluminum foil having surface areas coated with biaxially-oriented polyethylene terephthalate (BoPET).

In some embodiments, the container may include a fill hole configured to allow the phase-change material to be filled into the container.

In some embodiments, at least a portion of the enclosure may be made of metal or plastic.

In some embodiments, the substrate may include a PCB, and the at least one heat-generating device may include a processor chip or a battery.

In some embodiments, the enclosure may include a first primary side and a second primary side. The first primary side of the enclosure may include an interface unit coupled to the processor chip and configured to display information to a user or function as an I/O interface that provides information to the user and receives input from the user.

In some embodiments, at least a layer of the interface unit may be made of glass or sapphire.

In another aspect, an apparatus may include a main unit, a thermal management unit and an enclosure. The main unit may include a substrate and at least one heat-generating device disposed on the substrate. The thermal management unit may include a first silicon heat sink, a second silicon heat sink and a phase-change material. The first silicon heat sink may be coupled to the at least one heat-generating device and may include a base portion and a fin portion. The fin portion of the first silicon heat sink may include a plurality of fins protruding from the base portion. The second silicon heat sink may include a base portion and a fin portion. The fin portion of the second silicon heat sink may include a plurality of fins protruding from the base portion. The phase-change material may be in direct contact with at least the fin portion of the first silicon heat sink, and may be configured to absorb at least a portion of heat that is generated by the at least one heat-generating device and transferred through the first silicon heat sink. The enclosure may enclose the main unit and the thermal management unit therein. The second silicon heat sink may be coupled to the enclosure.

In some embodiments, the phase-change material may include a salt hydrate, an ionic liquid, paraffin, fatty acid, ester, an organic-organic compound, an organic-inorganic compound, or an inorganic-inorganic compound.

In some embodiments, each of the first silicon heat sink and the second silicon heat sink may be made of single-crystal silicon.

In some embodiments, the first silicon heat sink may further include walls around a periphery of the base portion such that the fin portion is surrounded by the walls.

In some embodiments, at least a portion of the enclosure may be made of metal or plastic.

In some embodiments, the at least one heat-generating device may include a battery, an integrated-circuit (IC) chip, or a combination thereof.

The foregoing summary is illustrative only and is not intended to be limiting in any way. That is, the foregoing summary is provided to introduce concepts relating to thermal management in an apparatus using a phase-change material and, optionally, one or more silicon heat sinks. Select embodiments of the novel and non-obvious technique are further described below in the detailed description. Thus, the foregoing summary is not intended to identify essential features of the claimed subject matter, nor is it intended for use in determining the scope of the claimed subject matter.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

Overview

The present disclosure describes embodiments of an apparatus that employs a phase-change material and, optionally, one or more silicon heat sinks for thermal management. In some implementations, the apparatus of the present disclosure may be a portable/mobile apparatus such as, for example, a tablet computer, a smartphone, a laptop computer, a digital personal assistant, a video game console or any apparatus that may benefit from one or more embodiments of the present disclosure. In other implementations, the apparatus of the present disclosure may not necessarily be a portable/mobile apparatus but may still benefit from one or more embodiments of the present disclosure.

According to the present disclosure, a phase-change material and, optionally, one or more silicon heat sinks may be employed to aid thermal management in the apparatus. In general, there are three main approaches to thermal management in an apparatus with a phase-change material and, optionally, one or more silicon heat sinks.

Figure 1:
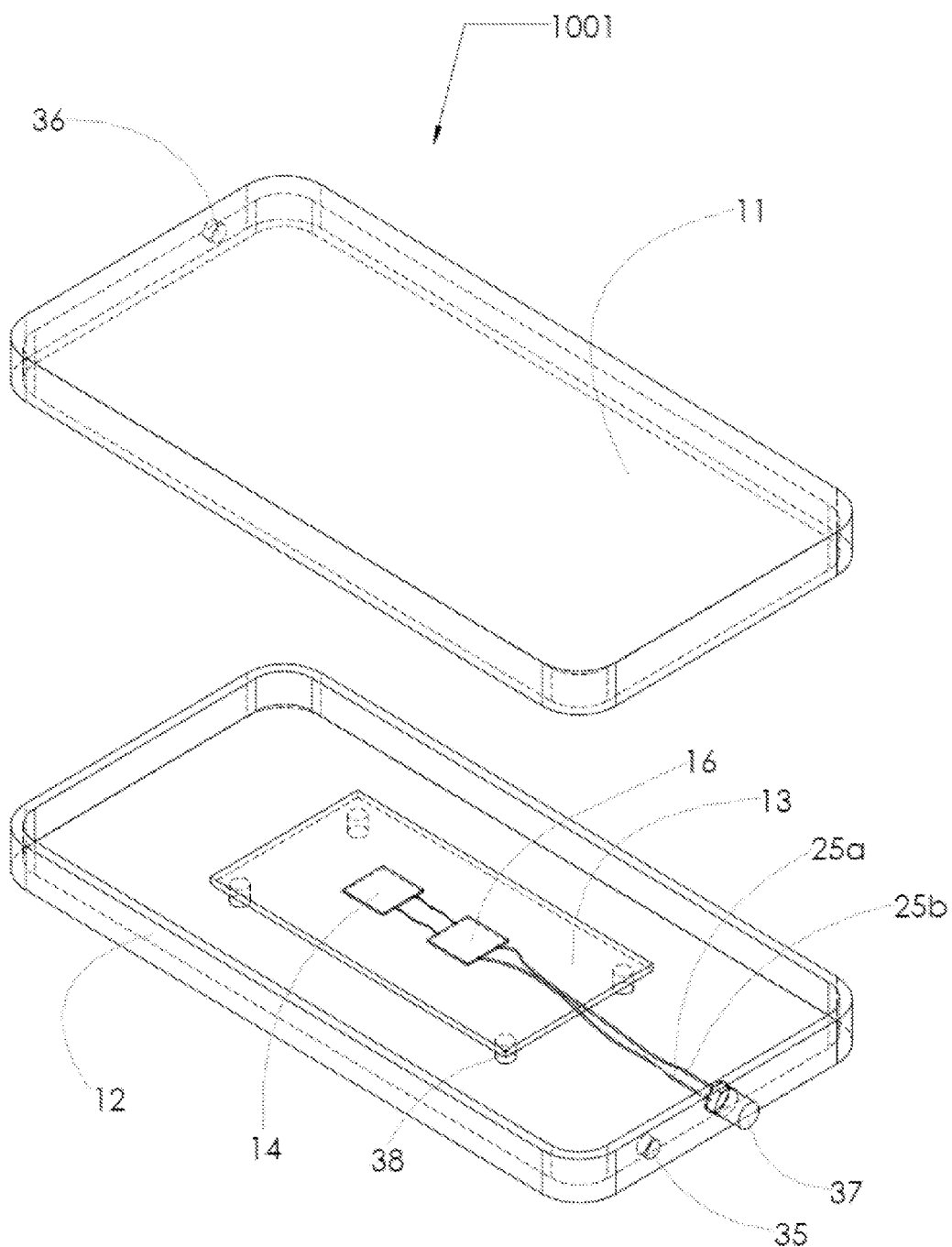
FIG. 1 is an exploded view of certain components of a thermal management package in accordance with some embodiments of the present disclosure.
Figure 2:
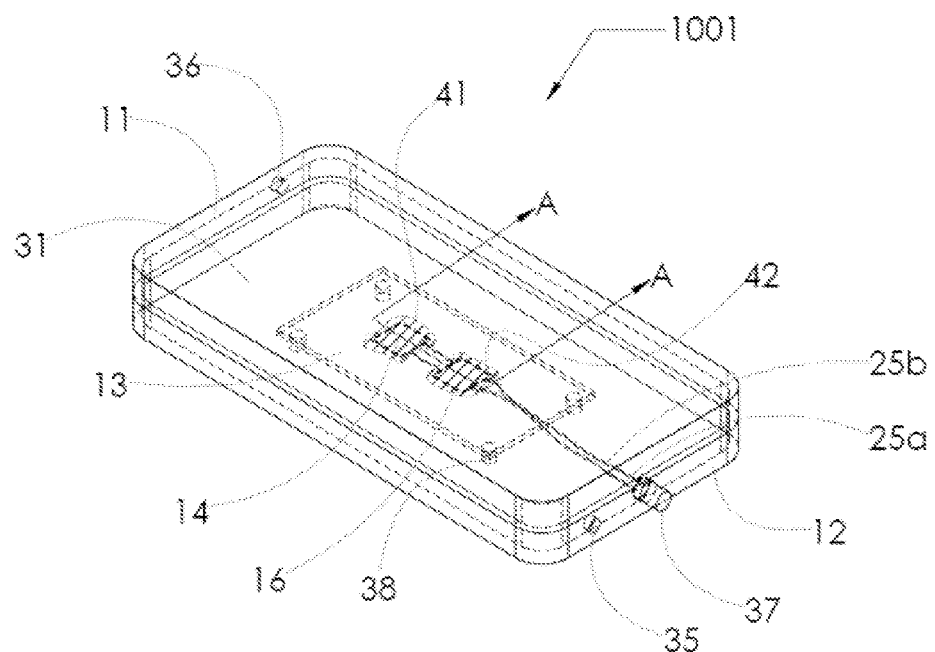
FIG. 2 is a perspective view of the thermal management package of FIG. 1 in accordance with some embodiments of the present disclosure.
Figure 3:
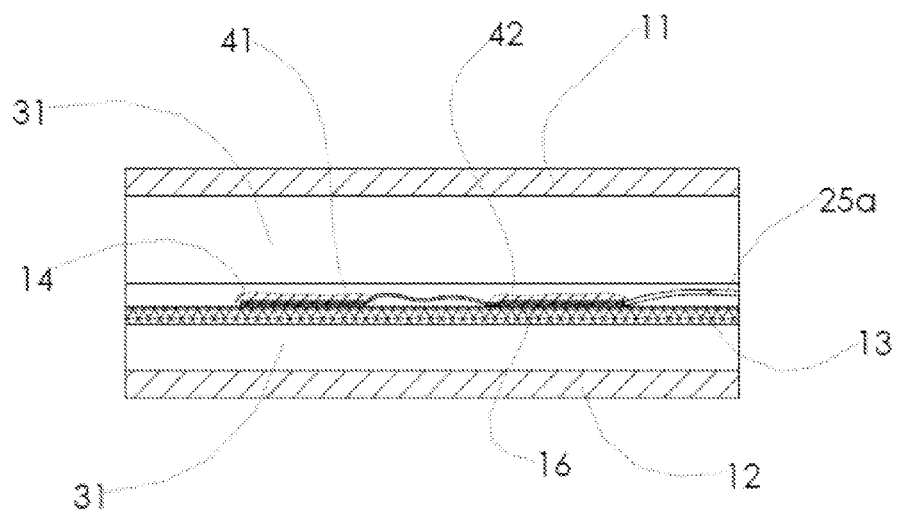
FIG. 3 is a cross-sectional view of the thermal management package of FIG. 1 in accordance with some embodiments of the present disclosure.

One approach is illustrated in FIG. 1-3. The apparatus, which may be seen as a thermal management package, includes an enclosure, or casing, that encloses a substrate, e.g., a PCB, having one or more heat-generating devices (e.g., IC chips or batteries) mounted or otherwise disposed thereon. The one or more heat-generating devices will generate heat during operation. Most or all components of the apparatus are contained inside the enclosure. With the apparatus assembled with electronic components disposed inside the enclosure, a phase-change material may be heated up to its liquid phase and injected into the enclosure through a filling port of the enclosure. Afterwards, the phase-change material will turn into a solid at room temperature. A primary function of the phase-change material is to absorb and dissipate the heat generated by the one or more heat-generating devices. Secondarily, the phase-change material may function as a sealant to prevent water from entering the enclosure. Additionally, the phase-change material may function as a shock absorbent for components inside the enclosure.

After the phase-change material absorbs a certain amount of heat from the one or more heat-generating devices, the temperature of the phase-change material surrounding the heat-generating one or more heat-generating devices will start to rise and may rise to the melting point of the phase-change material to result in the phase-change material melting locally, e.g., in a localized region surrounding the one or more heat-generating devices. If the one or more heat-generating devices continue to generate heat, which is absorbed by the phase-change material, a point may be reached where the entire phase-change material in the enclosure will melt.

The enclosure may be made of plastic or metal depending on the heat capacity of phase-change material. If the heat capacity of the phase-change material is large enough to absorb all heat from the one or more heat-generating device, then the enclosure may be made of a plastic material; otherwise, the enclosure may need to be made of a metallic material to allow continuous dissipation of the heat generated by the one or more heat-generating devices.

Figure 4:
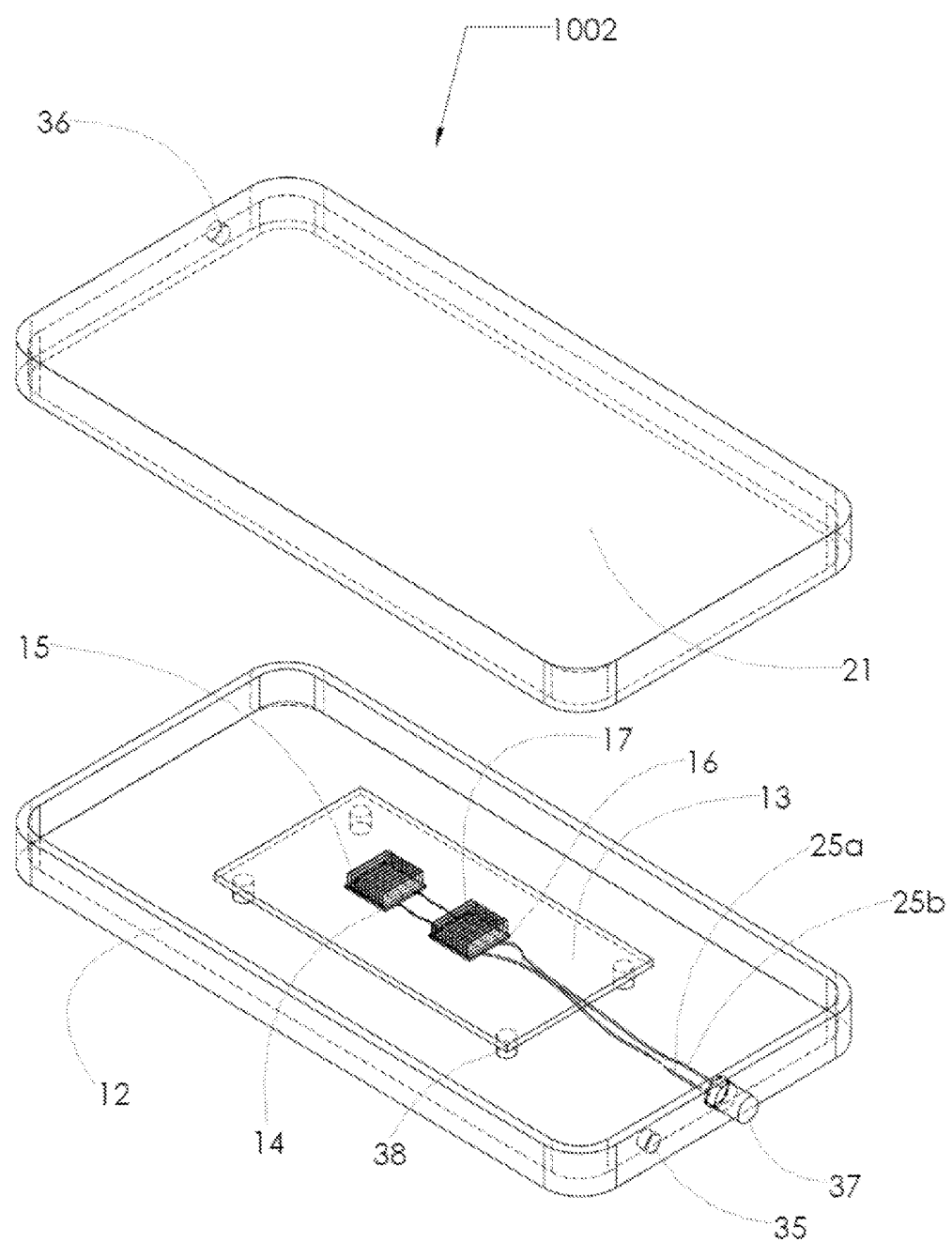
FIG. 4 is an exploded view of certain components of another apparatus in accordance with some embodiments of the present disclosure.
Figure 5:
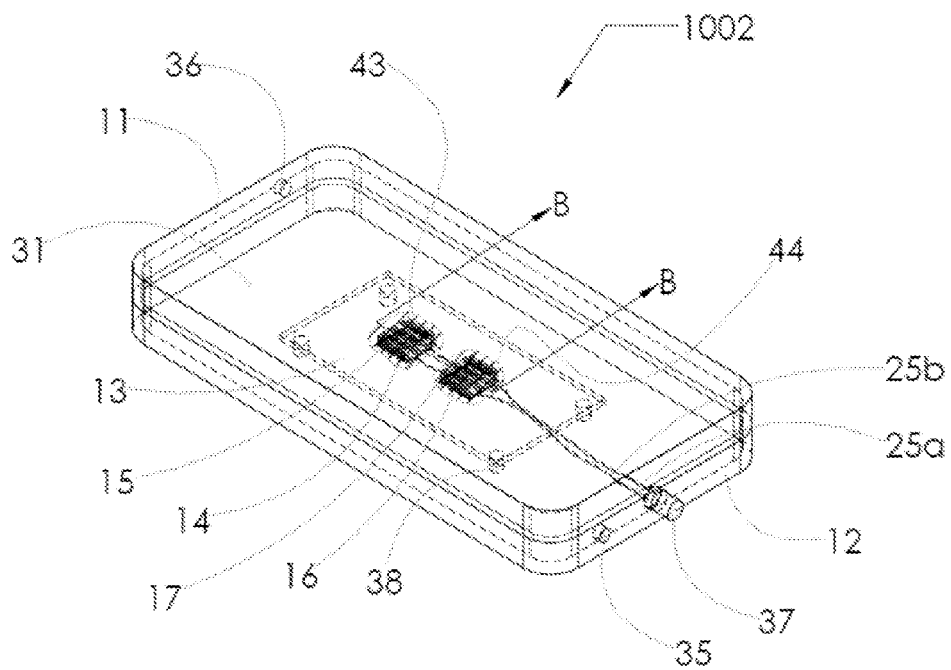
FIG. 5 is a perspective view of the thermal management package of FIG. 4 in accordance with some embodiments of the present disclosure.
Figure 6:
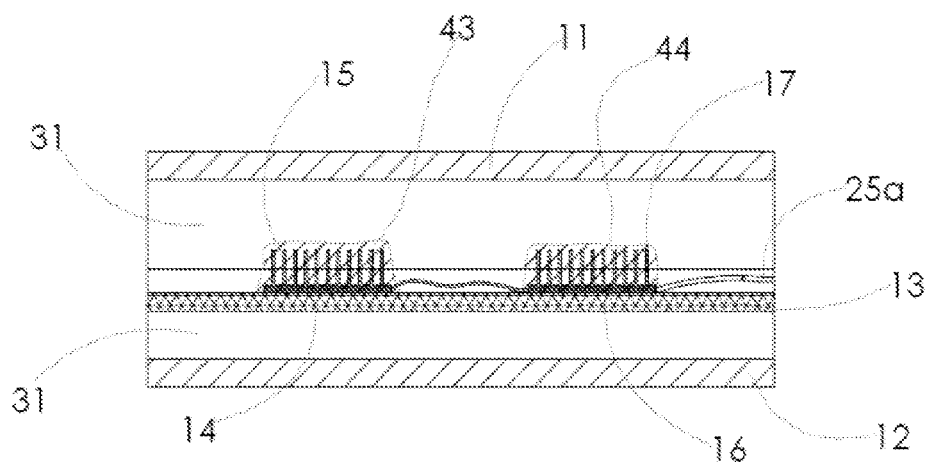
FIG. 6 is a cross-sectional view of the thermal management package of FIG. 4 in accordance with some embodiments of the present disclosure.

Another approach is illustrated in FIGS. 4-6. In this approach, in addition to filling the enclosure of the apparatus with a phase-change material, one or more silicon heat sinks are attached to, affixed to, mounted on, disposed on, or otherwise coupled to the one or more heat-generating devices. Typically, a phase-change material is not a good thermal conductor and, hence, it may be difficult for heat to transfer throughout the volume of the phase-change material. Attaching a silicon heat sink to each heat-generating device facilitates effective spreading of the heat generated by the heat-generating device as heat from the heat-generating device can be more effectively dissipated into the phase-change material through the silicon heat sink. More specifically, each silicon heat sink has a high density of silicon fins to allow quick dissipation of the heat into the phase-change material. As each heat sink is made of silicon, it has a good physical characteristics and is chemically inert with respect to any phase-change material currently available.

Figure 7:
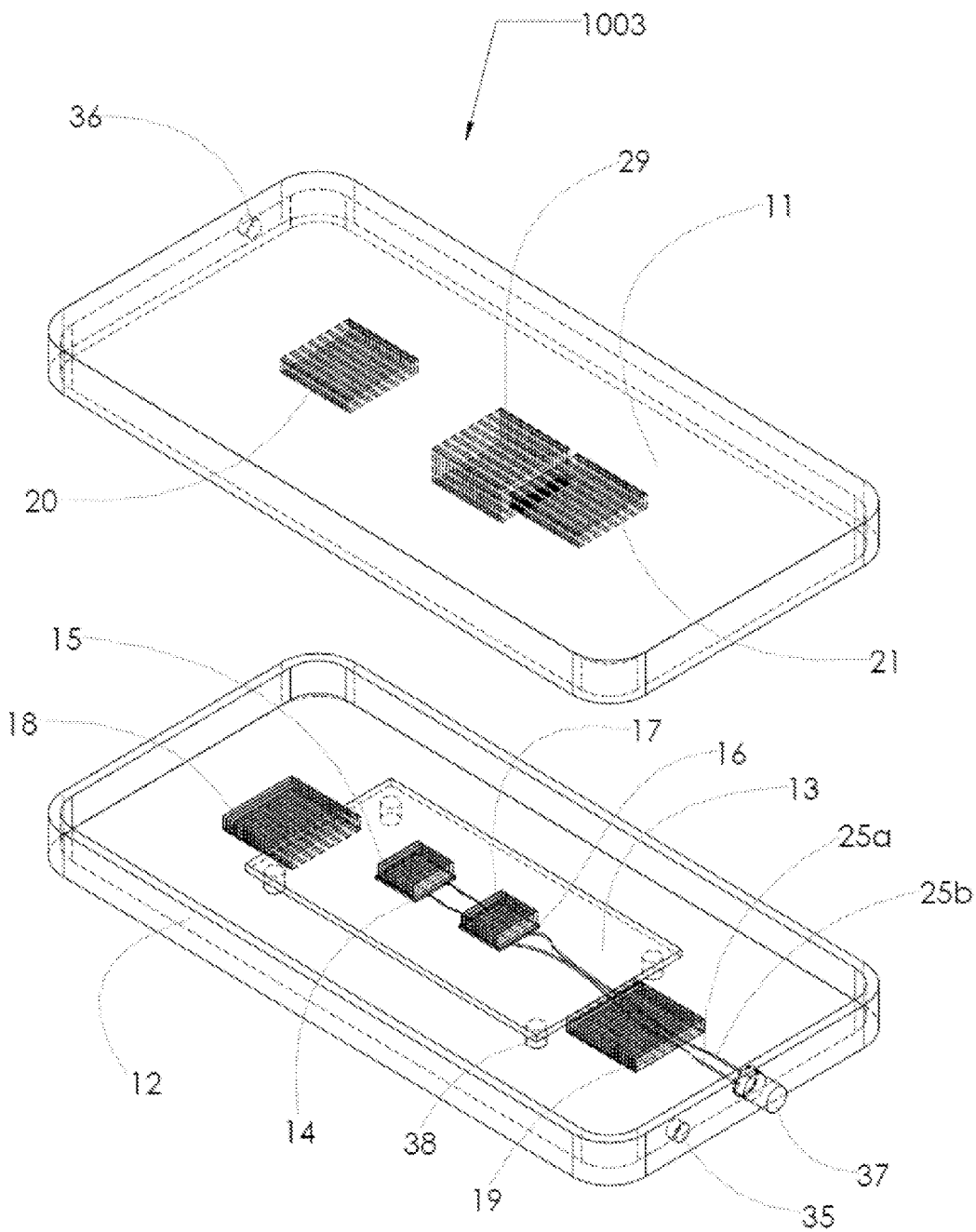
FIG. 7 is an exploded view of certain components of yet another thermal management package in accordance with some embodiments of the present disclosure.
Figure 8:
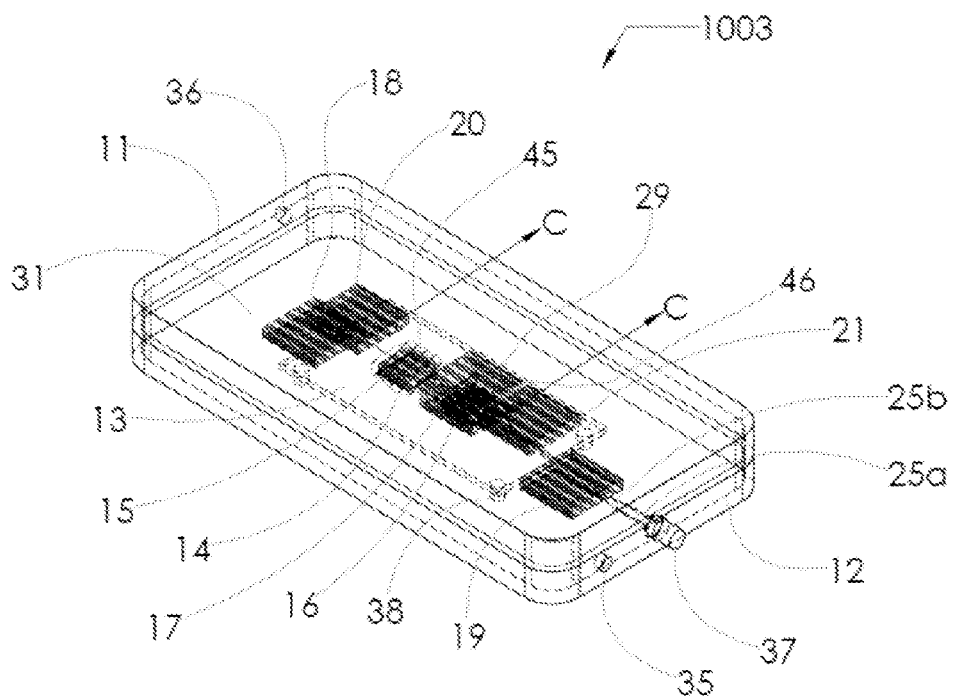
FIG. 8 is a perspective view of the thermal management package of FIG. 7 in accordance with some embodiments of the present disclosure.
Figure 9:
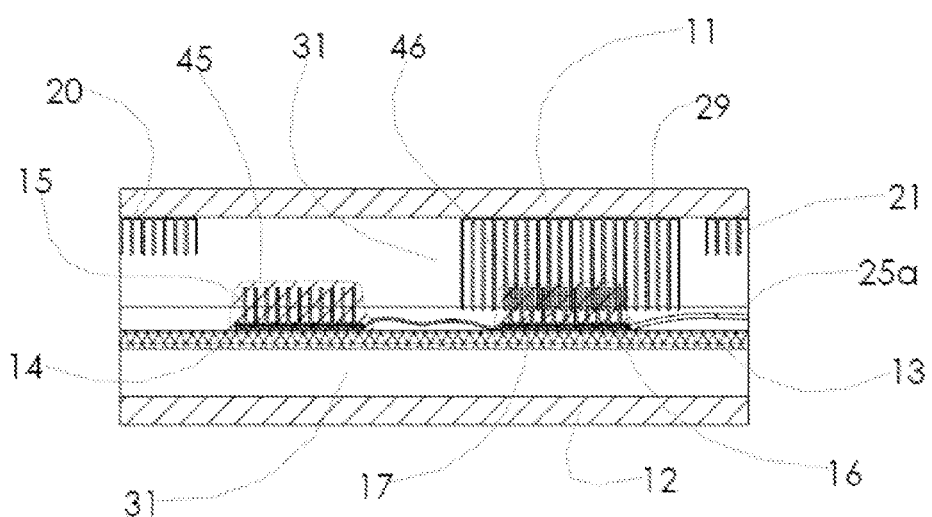
FIG. 9 is a cross-sectional view of the thermal management package of FIG. 7 in accordance with some embodiments of the present disclosure.

A further approach is illustrated in FIGS. 7-9. In this approach, the enclosure of the apparatus is made of metal. In addition to the one or more silicon heat sinks disposed on the one or more heat-generating devices, additional one or more silicon heat sinks are attached to, affixed to, mounted on, disposed on, or otherwise coupled to an inner surface of the enclosure. Since all the heat, or thermal energy, accumulated inside the enclosure eventually needs to be dissipated to the surrounding of the enclosure, the additional one or more silicon heat sinks attached to the enclosure facilitate efficient heat transfer from the phase-change material to the metal enclosure. The additional one or more silicon heat sinks may be strategically attached to one or more areas of the enclosure suitable for heat dissipation to the ambience through the enclosure.

In some implementations, the phase-change material is contained within a container and not in direct contact with the heat source, i.e., the one or more heat-generating devices. Various approaches in which the phase-change material is contained within a container and not in direct contact with the heat source are illustrated in FIGS. 11-23. The container may be, for example, an expandable pouch which may expand and come in contact with the enclosure, or casing, of the apparatus when at least a portion of the phase-change material has absorbed a certain amount of heat to change its phase, e.g., from an amorphous or solid state to a liquid state. Alternatively, the container may be a silicon cover that seals the phase-change material within a space between the silicon cover and a silicon heat sink which is coupled directly to the heat-generating device.

Illustrative Implementations

FIGS. 1-3 illustrate various views of an apparatus 1001 in accordance with an example implementation of the present disclosure.

As shown in FIGS. 1-3, apparatus 1001, which may be seen as a thermal management package, may include a main unit, a phase-change material 31, and an enclosure that encloses the main unit and the phase-change material 31 therein. In particular, FIG. 1 illustrates the apparatus 1001 during assembly, before the phase-change material 31 is filled in the enclosure, and FIGS. 2 and 3 illustrate the apparatus 1001 during operation with the phase-change material 31 filled in the enclosure.

The main unit may include a substrate 13 and at least one heat-generating device (e.g., integrated-circuit (IC) chip and/or battery), such as first heat-generating device 14 and second heat-generating device 16, disposed on the substrate 13. Apparatus 1001 and main unit may also include other circuitry or components not shown in the figures. For example, apparatus 1001 may include a battery that is not shown in the figures. It would be appreciated by those skilled in the art that, in order to highlight features of the present disclosure and not obscure the understanding and presentation of the key features of the present disclosure, certain components necessary for the operation of apparatus 1001 are omitted from the figures.

The enclosure may include a first casing 11 and a second casing 12 that, when coupled together, enclose the main unit and the phase-change material 31 in the enclosure. The main unit may be secured to, affixed on, mounted on or otherwise disposed on second casing 12 via one or more mechanical components 38. The at least one heat-generating device may be coupled to a power button 37 via wirings 25a and 25b of positive and negative electrical polarities such that the apparatus 1001 may be activated and deactivated by a user operating the power button 37. The enclosure may include a fill port 35 (e.g., on second casing 12) and a vent port 36 (e.g., on first casing 11) to facilitate filling the phase-change material 31 into the enclosure after the main unit, as well as any other circuitry or components of the apparatus 1001 not described herein, is enclosed in the enclosure.

The phase-change material 31 may be in direct contact with each of the heat-generating devices 14 and 16 of the at least one heat-generating device. The phase-change material 31 is configured to absorb at least a portion of heat generated by the at least one Heat-generating device during operation of the at least one heat-generating device. In some embodiments, the phase-change material 31 may surround heat-generating devices 14 and 16 of the at least one heat-generating device and may be in direct contact with the at least one heat-generating device and the enclosure.

In some embodiments, the phase-change material 31 may substantially fill a void between the main unit and the enclosure. This way, in addition to absorbing and dissipating the heat generated by the one or more heat-generating devices, the phase-change material 31 may function as a sealant to prevent water from entering the enclosure. Additionally, the phase-change material 31 may function as a shock absorbent for components inside the enclosure.

In some embodiments, the phase-change material 31 may include a salt hydrate, an ionic liquid, paraffin, fatty acid, ester, an organic-organic compound, an organic-inorganic compound, or an inorganic-inorganic compound.

FIGS. 2 and 3 illustrate an example scenario of the apparatus 1001 after operation for a period of time. After the phase-change material 31 absorbs a certain amount of heat from the first and second heat-generating devices 14 and 16, the temperature of the phase-change material 31 surrounding the heat-generating first and second heat-generating devices 14 and 16 will start to rise and may rise to the melting point of the phase-change material 31 to result in the phase-change material 31 melting locally, e.g., in a localized region surrounding the first and second heat-generating devices 14 and 16, as indicated by local melting regions 41 and 42 of the phase-change material 31. The localized melting of the phase-change material 31 promotes more effective heat transfer away from the first and second heat-generating devices 14 and 16 as the portion of the phase-change material 31 in the local melting regions 41 and 42 is in the liquid phase, which tends to transfer heat away from first and second heat-generating devices 14 and 16 by convection better than it does in the solid phase. If the first and second heat-generating devices 14 and 16 continue to generate heat, which is absorbed by the phase-change material 31, a point may be reached where the entire phase-change material 31 in the enclosure will melt.

In some embodiments, at least a portion of the enclosure may be made of metal or plastic.

In some embodiments, the substrate 13 may include a PCB, and the at least one heat-generating device may include a processor chip. For example, first heat-generating device 14 may be a processor chip or a battery and second heat-generating device 16 may be a graphics chip, a communication chip, a memory chip or a battery.

In some embodiments, the enclosure may include a first primary side (e.g., on first casing 11) and a second primary side (e.g., on second casing 12). The first primary side of the enclosure may include an interface unit (not shown) coupled to the processor chip (e.g., first heat-generating device 14) and configured to display information to a user or function as an I/O interface that provides information to the user and receives input from the user. For example, the interface unit may be a touch screen of the apparatus 1001.

In some embodiments, at least a layer of the interface unit may be made of glass or sapphire. For example, the interface unit may be a touch screen having an outer layer that forms a part of the exterior surface of first casing 11, and the outer layer is made of glass or sapphire.

FIGS. 4-6 illustrate various views of an apparatus 1002 in accordance with another example implementation of the present disclosure.

Certain features of apparatus 1002 are similar or identical to corresponding features of apparatus 1001. Thus, in the interest of brevity the description of apparatus 1002 below primarily focuses on those features of apparatus 1002 that are lacking or different from corresponding features in apparatus 1001.

As shown in FIGS. 4-6, the apparatus 1002, which may be seen as a thermal management package, may include at least one silicon heat sink, such as first silicon heat sink 15 and second silicon heat sink 17. Each silicon heat sink of the at least one silicon heat sink may include a base portion and a fin portion. The fin portion may include a plurality of fins protruding from the base portion.

In some embodiments, the at least one silicon heat sink may include one or more heat sinks made of single-crystal silicon. For example, either or both of first and second silicon heat sinks 15 and 17 may be made of single-crystal silicon.

In some embodiments, the at least one silicon heat sink may include first silicon heat sink 15 corresponding to and attached to, affixed to, mounted on, disposed on, or otherwise coupled to first heat-generating device 14 of the at least one heat-generating device. Likewise, the at least one silicon heat sink may also include second silicon heat sink 17 corresponding to and attached to, affixed to, mounted on, disposed on, or otherwise coupled to second heat-generating device 16 of the at least one heat-generating device. For example, first and second silicon heat sinks 15 and 17 may be bonded to first and second heat-generating devices 14 and 16, respectively, by thermally-conductive epoxy or solder.

The addition of the at least one silicon heat sink allows heat from the at least one heat-generating device to be more effectively dissipated into the phase-change material 31 through each silicon heat sink of the at least one silicon heat sink. More specifically, each of the first and second silicon heat sinks 15 and 17 has a high density of silicon fins to allow quick dissipation of the heat into the phase-change material 31. As each of the first and second heat sink 15 and 17 is made of silicon, it has a good physical characteristics and is chemically inert with respect to any phase-change material currently available.

FIGS. 5 and 6 illustrate an example scenario of the apparatus 1002 after operation for a period of time. After the phase-change material 31 absorbs a certain amount of heat from the first and second heat-generating devices 14 and 16 through the first and second silicon heat sinks 15 and 17, the temperature of the phase-change material 31 surrounding the first and second silicon heat sinks 15 and 17 will start to rise and may rise to the melting point of the phase-change material 31 to result in the phase-change material 31 melting locally, e.g., in a localized region surrounding first and second silicon heat sinks 15 and 17, as indicated by local melting regions 43 and 44 of the phase-change material 31. The localized melting of the phase-change material 31 promotes more effective heat transfer away from the first and second silicon heat sinks 15 and 17 and from the first and second heat-generating devices 14 and 16 as the portion of the phase-change material 31 in the local melting regions 43 and 44 is in the liquid phase, which tends to transfer heat away from first and second silicon heat sinks 15 and 17 by convection better than it does in the solid phase. If the first and second heat-generating devices 14 and 16 continue to generate heat, which is absorbed by the phase-change material 31, a point may be reached where the entire phase-change material 31 in the enclosure will melt.

FIGS. 7-9 illustrate various views of an apparatus 1003 in accordance with yet another example implementation of the present disclosure.

Certain features of apparatus 1003 are similar or identical to corresponding features of apparatus 1001 and apparatus 1002. Thus, in the interest of brevity the description of apparatus 1003 below primarily focuses on those features of apparatus 1003 that are lacking or different from corresponding features in apparatus 1001 and apparatus 1002.

In this example implementation, the enclosure is made of metal. As shown in FIGS. 7-9, apparatus 1003, which may be seen as a thermal management package, may include at least one additional silicon heat sink, such as additional silicon heat sinks 18, 19, 20, 21 and 29, disposed on the enclosure. In the example shown in FIGS. 7-9, additional silicon heat sinks 18 and 19 are disposed on second casing 12 of the enclosure, and additional silicon heat sinks 20, 21 and 29 are disposed on first casing 11 of the enclosure.

In some embodiments, the at least one additional silicon heat sink may be disposed on an inner side of the enclosure facing a side of the substrate 13 on which the at least one heat-generating device is disposed. For example, additional silicon heat sinks 20, 21 and 29 are disposed on an inner side of first casing 11 of the enclosure that faces the side of the substrate 13 on which first and second heat-generating devices 14 and 16 are disposed.

The fins of the at least one silicon heat sink may protrude from the base portion thereof in a first direction and the fins of the at least one additional silicon heat sink may protrude from the base portion thereof in a second direction opposite to the first direction. For example, the fins of first and second silicon heat sinks 15 and 17 may protrude from the base portion thereof in a first direction (e.g., upward as shown in FIGS. 7-9) and the fins of additional silicon heat sinks 20, 21 and 29 may protrude from the base portion thereof in a second direction opposite to the first direction (e.g., downward as shown in FIGS. 7-9).

In some embodiments, the at least one additional silicon heat sink may be aligned with the first silicon heat sink. For example, as shown in FIGS. 7-9, additional silicon heat sink 29 may be aligned with second silicon heat sink 17.

In some embodiments, at least one of the fins of the first silicon heat sink may be disposed between respective two adjacent fins of the at least one additional silicon heat sink, and at least one of the fins of the at least one additional silicon heat sink may be disposed between respective two adjacent fins of the first silicon heat sink. For example, as shown in FIG. 9, at least one of the fins of second silicon heat sink 17 may be disposed between respective two adjacent fins of additional silicon heat sink 29, and at least one of the fins of additional silicon heat sink 29 may be disposed between respective two adjacent fins of second silicon heat sink 17.

FIGS. 5 and 6 illustrate an example scenario of the apparatus 1002 after operation for a period of time. After the phase-change material 31 absorbs a certain amount of heat from the first and second heat-generating devices 14 and 16 through the first and second silicon heat sinks 15 and 17, the temperature of the phase-change material 31 surrounding the first and second silicon heat sinks 15 and 17 will start to rise and may rise to the melting point of the phase-change material 31 to result in the phase-change material 31 melting locally, e.g., in a localized region surrounding first and second silicon heat sinks 15 and 17, as indicated by local melting regions 45 and 46 of the phase-change material 31. The localized melting of the phase-change material 31 promotes more effective heat transfer away from the first and second silicon heat sinks 15 and 17 and from the first and second heat-generating devices 14 and 16 as the portion of the phase-change material 31 in the local melting regions 45 and 46 is in the liquid phase, which tends to transfer heat away from first and second silicon heat sinks 15 and 17, e.g., at least to additional silicon heat sink 29, by convection better than it does in the solid phase. If the first and second heat-generating devices 14 and 16 continue to generate heat, which is absorbed by the phase-change material 31, a point may be reached where the entire phase-change material 31 in the enclosure will melt.

In summary, additional silicon heat sinks 18, 19, 20, 21 and 29 attached to the enclosure facilitate efficient heat transfer from the phase-change material 31 to the metal enclosure. The additional silicon heat sinks 18, 19, 20, 21 and 29 may be strategically attached to one or more areas of the enclosure suitable for heat dissipation to the ambience through the enclosure.

In some embodiments, in apparatus 1002 and/or apparatus 1003, or any variation thereof, one or more of the at least one silicon heat sink may be substituted by allotropes of carbon. The allotropes of carbon may be in the form of, for example, diamond or an array of cylindrical nanostructure also known as carbon nanotubes. In some embodiments, the carbon nanotubes may be disposed on one or more of the at least one heat-generating device with most, if not all, of the carbon nanotubes oriented in a way such that a longitudinal axis of each of most, if not all, of the carbon nanotubes is approximately perpendicular to a surface of the one or more of the at least one heat-generating device on which the carbon nanotubes are disposed. The carbon nanotubes may be arranged in an array of rows and columns with spatial gap between adjacent rows and/or columns to provide space to accommodate the phase-change material so that heat may be effectively transferred from the one or more heat-generating devices to the phase-change material through the carbon nanotubes.

Figure 10:
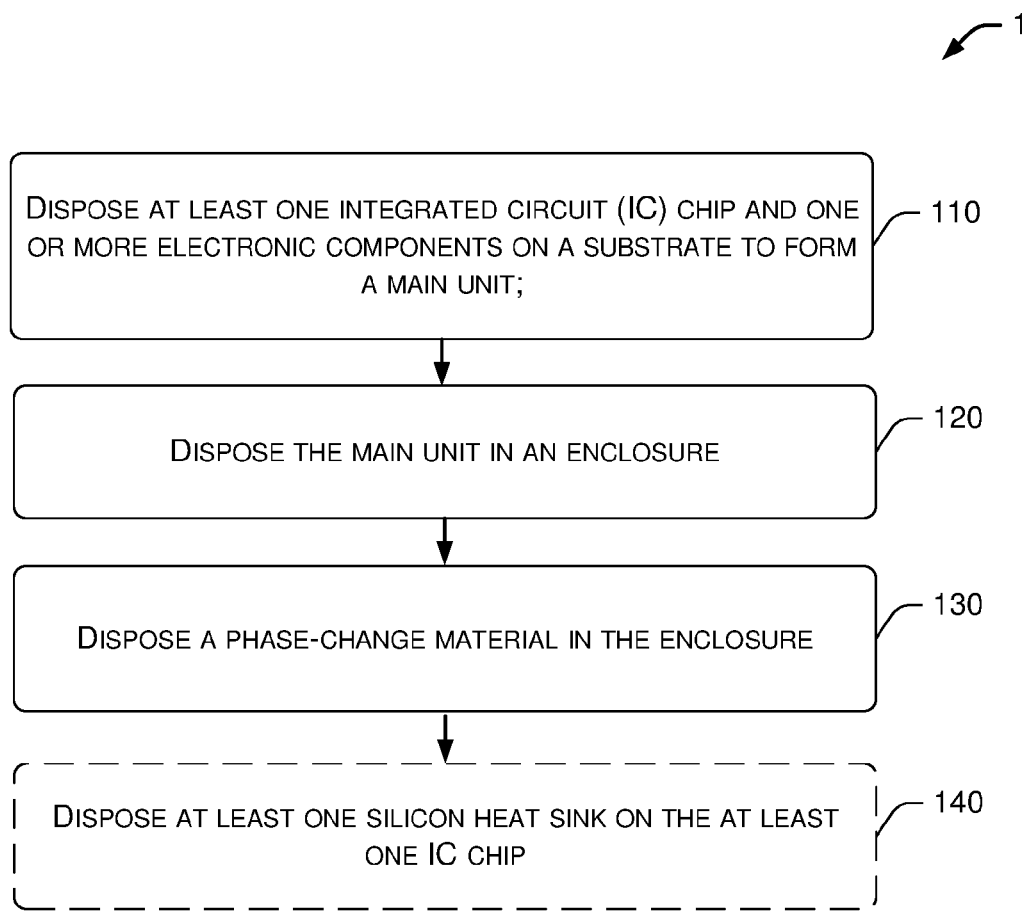
FIG. 10 is a flowchart of a processing flow of assembling an thermal management package in accordance with some embodiments of the present disclosure.

FIG. 10 illustrates a processing flow 100 of assembling an apparatus in accordance with some embodiments of the present disclosure.

Processing flow 100 may be implemented in one or more assembly lines in one or more factories. Further, processing flow 100 may include one or more operations, actions, or functions depicted by one or more blocks 110, 120, 130 and 140. Although illustrated as discrete blocks, various blocks may be divided into additional blocks, combined into fewer blocks, or eliminated, depending on the desired implementation. Processing flow 100 may begin at block 110.

At 110, processing flow 100 may include disposing at least one heat-generating device and one or more electronic components on a substrate to form a main unit. For example, processing flow 100 may dispose first and second heat-generating devices 14 and 16 on substrate 13.

At 120, processing flow 100 may include disposing the main unit in an enclosure. For example, processing flow 100 may dispose the main unit in the enclosure as shown in FIG. 1.

At 130, processing flow 100 may include disposing a phase-change material in the enclosure. For example, processing flow 100 may inject the phase-change material 31 in a liquid phase into the enclosure such that the phase-change material 31 surrounds the at least one heat-generating device and is in direct contact with the at least one heat-generating device and the enclosure.

In some embodiments, in injecting the phase-change material in a liquid phase into the enclosure, processing flow 100 may include substantially filling a void between the main unit and the enclosure with the phase-change material.

In some embodiments, the phase-change material may include a salt hydrate, an ionic liquid, paraffin, fatty acid, ester, an organic-organic compound, an organic-inorganic compound, or an inorganic-inorganic compound.

Optionally, processing flow 100 may further include disposing at least one silicon heat sink on the at least one heat-generating device. For example, processing flow 100 may dispose first and second silicon heat sinks 15 and 17 on first and second heat-generating devices 14 and 16, respectively. Each silicon heat sink of the at least one silicon heat sink may include a base portion and a fin portion. The fin portion may include a plurality of fins protruding from the base portion.

In some embodiments, the at least one silicon heat sink may include one or more heat sinks made of single-crystal silicon.

In some embodiments, in disposing the at least one silicon heat sink on the at least one heat-generating device, processing flow 100 may include disposing a first silicon heat sink of the at least one silicon heat sink on a first heat-generating device of the at least one heat-generating device.

In some embodiments, processing flow 100 may further include disposing at least one additional silicon heat sink of the at least one silicon heat sink on the enclosure. For example, processing flow 100 may dispose additional silicon heat sinks 18, 19, 20, 21 and 29 on the enclosure.

In some embodiments, in disposing the at least one additional silicon heat sink on the enclosure, processing flow 100 may include bonding, by thermally-conductive epoxy or solder, the at least one additional silicon heat sink on an inner side of the enclosure facing a side of the substrate on which the at least one heat-generating device is disposed. For example, processing flow 100 may bond each of additional silicon heat sinks 18, 19, 20, 21 and 29 to first and second casings 11 and 12 of the enclosure, respectively, by thermally-conductive epoxy or solder.

The fins of the at least one silicon heat sink may protrude from the base portion thereof in a first direction and the fins of the at least one additional silicon heat sink may protrude from the base portion thereof in a second direction opposite to the first direction. For example, the fins of first and second silicon heat sinks 15 and 17 may protrude from the base portion thereof in a first direction (e.g., upward as shown in FIGS. 7-9) and the fins of additional silicon heat sinks 20, 21 and 29 may protrude from the base portion thereof in a second direction opposite to the first direction (e.g., downward as shown in FIGS. 7-9).

In some embodiments, the at least one additional silicon heat sink may be aligned with the first silicon heat sink. For example, as shown in FIGS. 7-9, additional silicon heat sink 29 may be aligned with second silicon heat sink 17.

In some embodiments, at least one of the fins of the first silicon heat sink may be disposed between respective two adjacent fins of the at least one additional silicon heat sink, and at least one of the fins of the at least one additional silicon heat sink may be disposed between respective two adjacent fins of the first silicon heat sink. For example, as shown in FIG. 9, at least one of the fins of second silicon heat sink 17 may be disposed between respective two adjacent fins of additional silicon heat sink 29, and at least one of the fins of additional silicon heat sink 29 may be disposed between respective two adjacent fins of second silicon heat sink 17.

In some embodiments, at least a portion of the enclosure may be made of metal or plastic.

In some embodiments, the substrate may include a PCB, and the at least one heat-generating device may include a processor chip.

In some embodiments, the enclosure may include a first primary side and a second primary side. The first primary side of the enclosure may include an interface unit coupled to the processor chip and configured to display information to a user or function as an I/O interface that provides information to the user and receives input from the user.

In some embodiments, at least a layer of the interface unit may be made of glass or sapphire.

Figure 11:
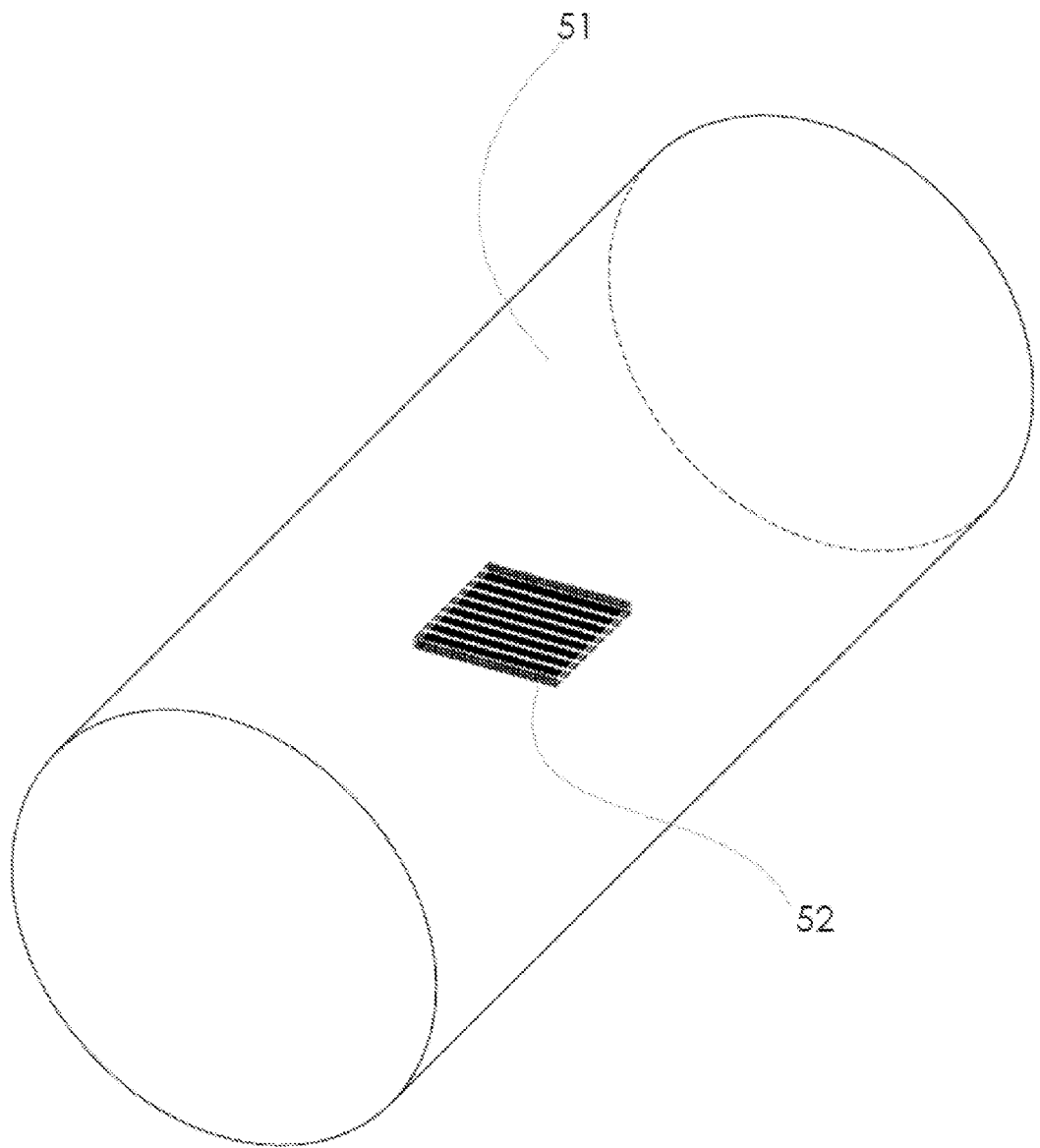
FIG. 11 is a perspective view of a thermal management unit of a thermal management package in accordance with some embodiments of the present disclosure.

FIG. 11 illustrates a general concept of a thermal management unit of an apparatus in accordance with some embodiments of the present disclosure. As shown in FIG. 11, embodiments of the thermal management unit include at least a silicon heat sink 52 and a container 51. The size, shape and material of the container 51 may vary depending on the need of implementation, and several examples thereof are described further in detail below.

Figure 12:
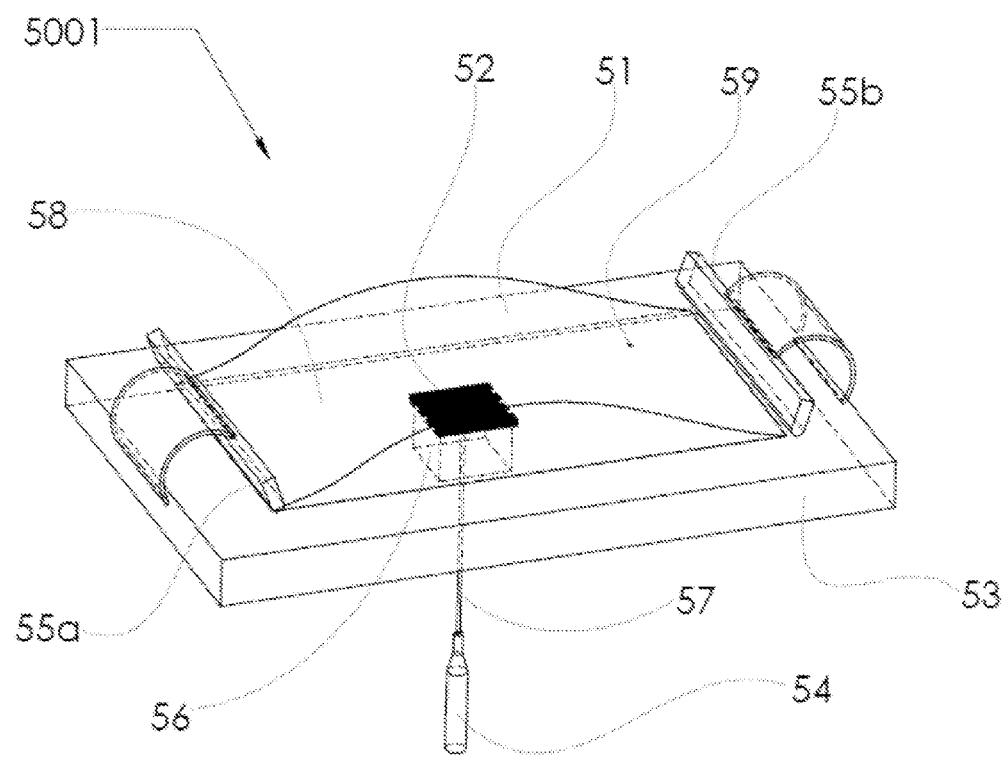
FIG. 12 is a diagram showing the assembly of a thermal management unit in accordance with some embodiments of the present disclosure.
Figure 13:
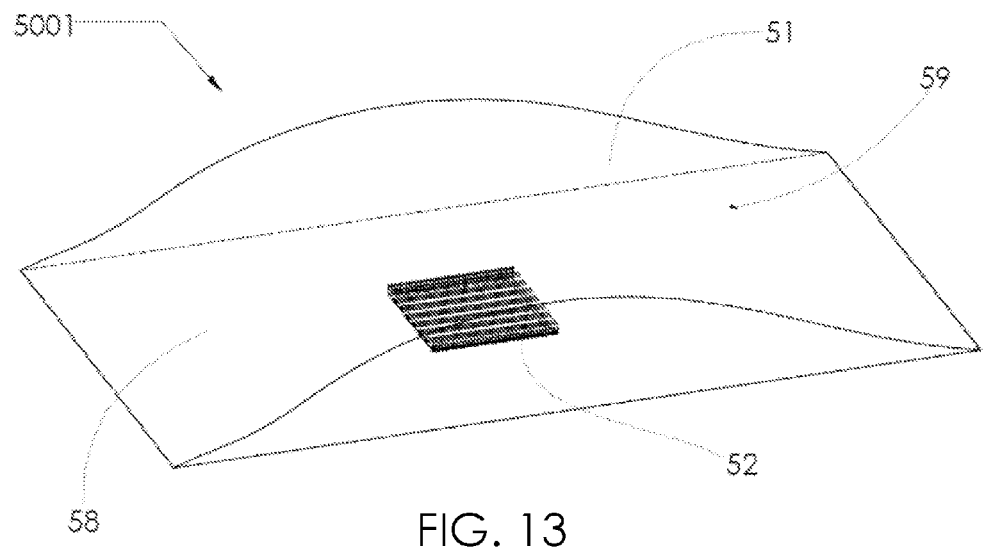
FIG. 13 is a top perspective view of a thermal management unit of a thermal management package in accordance with some embodiments of the present disclosure.
Figure 14:
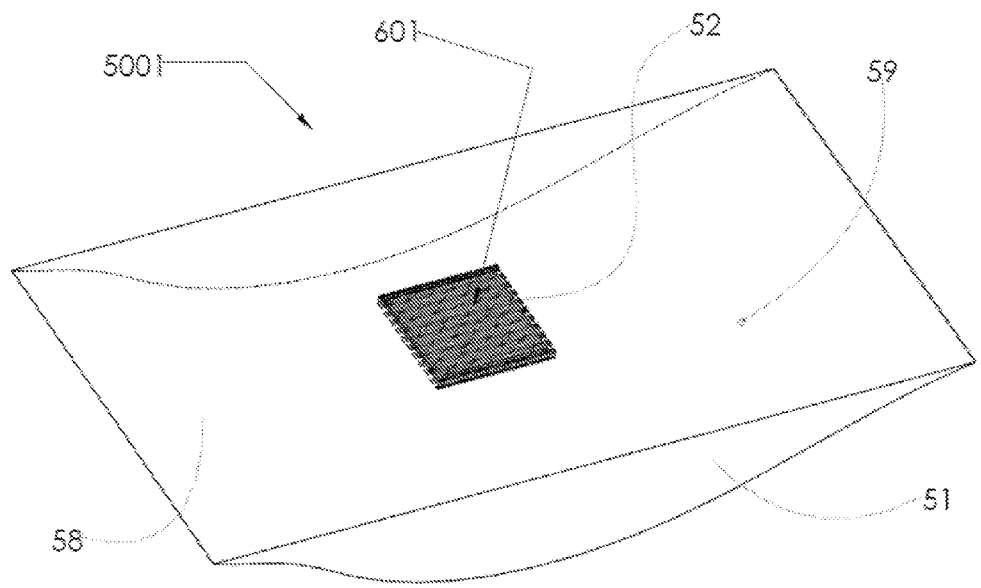
FIG. 14 is a bottom perspective view of the thermal management unit of FIG. 13.
Figure 15:
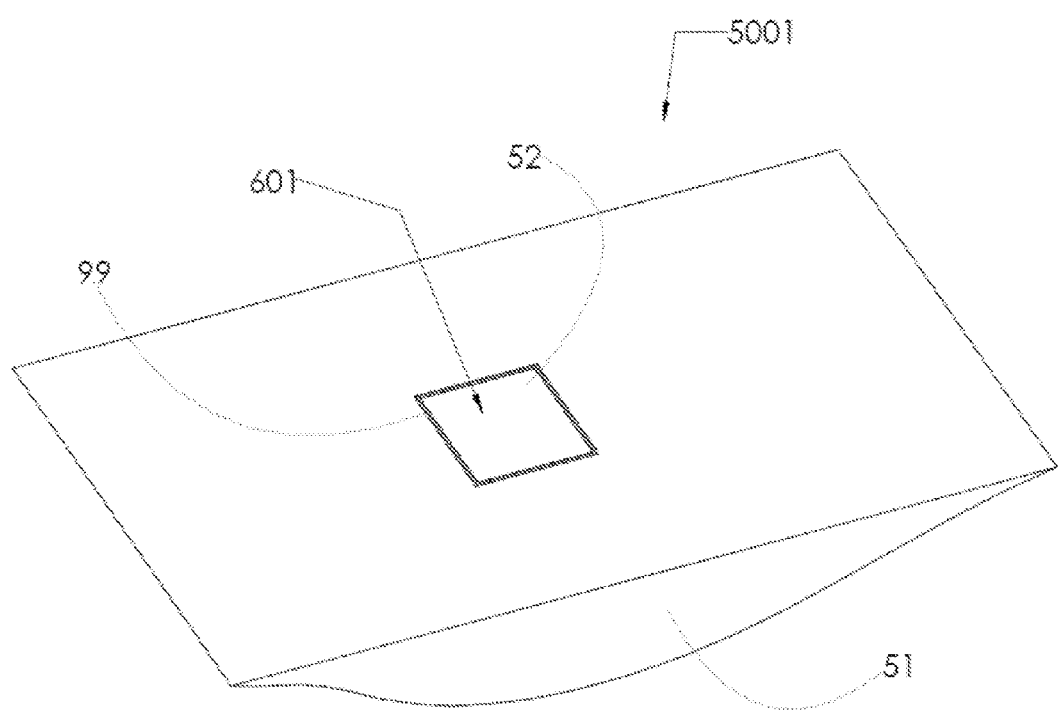
FIG. 15 is another bottom perspective view of the thermal management unit of FIG. 13.

FIG. 12 illustrates the assembly of a thermal management unit 5001 in accordance with some embodiments of the present disclosure. FIGS. 13-15 illustrate the thermal management unit 5001 in accordance with some embodiments of the present disclosure. The following description pertains to FIGS. 12-15.

As shown in FIG. 12, the thermal management unit 5001 includes a container 51, a silicon heat sink 52, and a phase-change material 58 contained within the container 51. The container 51 may be a pouch. The pouch may include a metallic foil made of a malleable material with desirable thermal conductivity such as, for example, aluminum, gold, iron, copper, lead, etc. For example, the pouch may include an aluminum foil having surface areas coated with biaxially-oriented polyethylene terephthalate (BoPET), also known by its trade name of Mylar. In some embodiments, the container 51 is a laminated aluminum foil with plastic layers (e.g., Mylar) coated on both sides of the aluminum foil. The container 51 includes a fill hole 59 through which the phase-change material 58 may be filled or otherwise injected into the container 51, e.g., when in the liquid state. In the interest of brevity, in the examples described below laminated aluminum foil with plastic layers is used as the material for the container. It would be appreciated by those skilled in the art that the scope of the container of the present disclosure is not limited thereto.

In one example implementation, during the assembly of the thermal management unit 5001, the thermal unit may be placed on a tooling base 53 that is heated to melt the phase-change material 58 into the liquid state. The pouch of the container 51 is sealed by pouch sealer 55a/55b, e.g., the plastic layers are melted to seal the pouch. The tooling base 53 has an opening or cavity 56 through which a laser tip 54 emits a laser beam 57 to seal the laminated aluminum foil of the container 51 to the silicon heat sink 52 and to cut off the laminated aluminum foil to expose at least a portion 601 of the base portion of the silicon heat sink 52. This allows the exposed portion 601 of the silicon heat sink 52 to be in direct contact with the heat-generating device when disposed thereon.

As shown in FIG. 15, the silicon heat sink 52 is bonded to the laminated aluminum foil of the container 51. For example, the silicon heat sink 52 may be bonded to the laminated aluminum foil with plastic layers by heat-pressure bonding using polyethylene (LLDPE), epoxy, or solder. A seal area 99 of the laminated aluminum foil of the container 51 may be sealed to the silicon heat sink 52 along a periphery of the base portion of the silicon heat sink 52. The sealing may be done by heat (e.g., laser) and pressure, solder, a pressure-sensitive adhesive, or epoxy, etc. The fill hole 59 is sealed after the phase-change material 58 is filled into the container 51. For example, the fill hole 59 may be sealed by two parts epoxy or ultraviolet (UV) curing. In any event, the fill hole 59 is small such that evaporation of the phase-change material 58 is minimal.

The silicon heat sink 52 is exposed to the phase-change material 58 inside the container 51 due to the low thermal conductivity of phase-change materials in general. That is, fins of the fin portion of the silicon heat sink 52 function as heat spreader to enhance heat transfer from the heat-generating device to the phase-change material 58 through the silicon heat sink 52. Without the heat spreading function of the silicon heat sink 52, the phase-change material 58 would take longer to dissipate the heat generated by the heat source, e.g., the heat-generating device, and this would undesirably result in the temperature of the heat-generating device rising fast if the heat is not transferred fast enough into the phase-change material 58. Accordingly, the silicon heat sink 52 aids the transfer of heat from the heat-generating device to the phase-change material 58 which is contained in the container 51.

Figure 16:
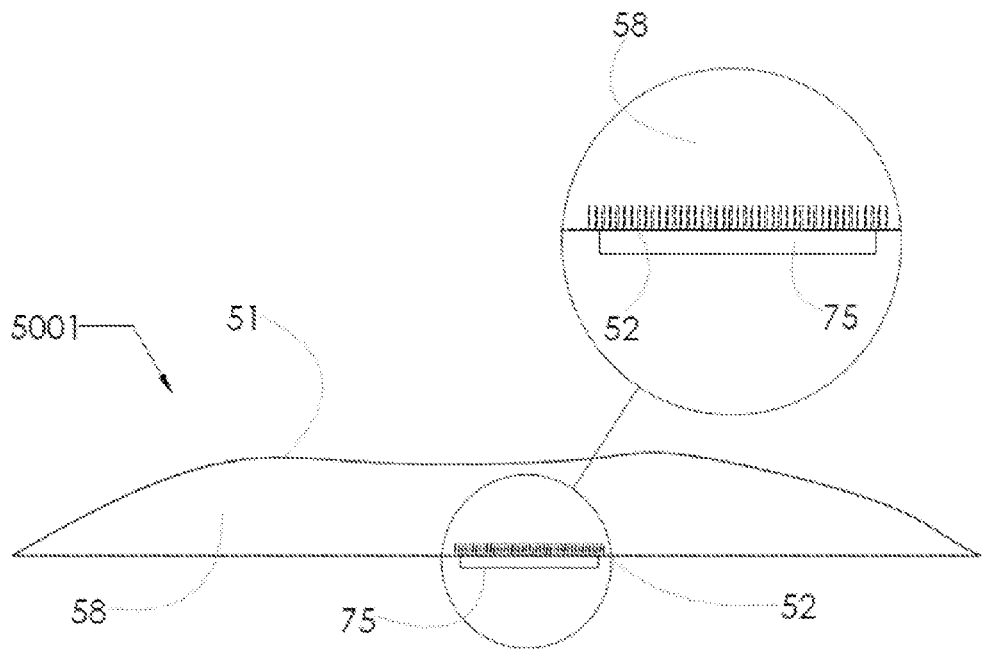
FIG. 16 is a cross-sectional view of a thermal management unit of a thermal management package in accordance with some embodiments of the present disclosure.

FIG. 16 illustrates a cross-sectional view of the thermal management unit 5001 attached to a heat source 75. The thermal management unit 5001 includes a container 51, a silicon heat sink 52, a phase-change material 58 contained within the container 51. As shown in FIG. 16, the container 51, e.g., laminated aluminum foil with plastic layers, is coupled to the bottom side (e.g., the base portion) of the silicon heat sink 52 which is disposed on, attached to, or otherwise bonded to the heat source 75 (e.g., IC chip(s) and/or battery/batteries).

Figure 17:
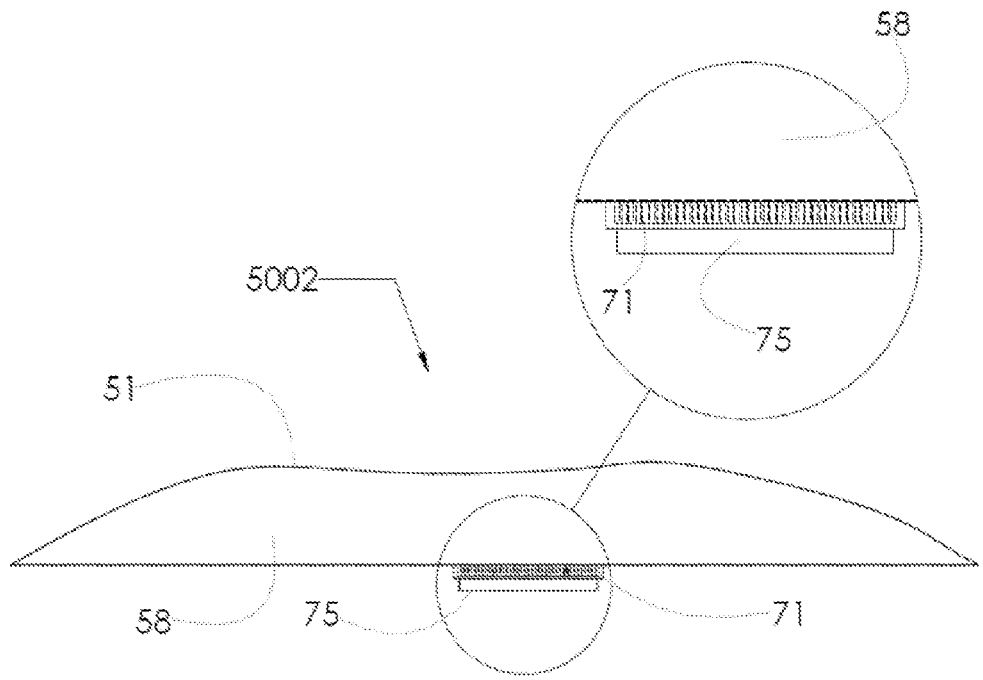
FIG. 17 is a cross-sectional view of a thermal management unit of another thermal management package in accordance with some embodiments of the present disclosure.

FIG. 17 illustrates a cross-sectional view of a thermal management unit 5002 attached to a heat source 75. The thermal management unit 5002 includes a container 51, a silicon heat sink 71, a phase-change material 58 contained within the container 51. As shown in FIG. 71, the container 51, e.g., laminated aluminum foil with plastic layers, is coupled to the top side (e.g., the fin portion) of the silicon heat sink 71 which is exposed to the phase-change material 58 inside the container 51 through an opening in the container 51. The silicon heat sink 71 includes walls around a periphery of the base portion such that the fin portion of the silicon heat sink 71 is surrounded by the walls.

Figure 18:
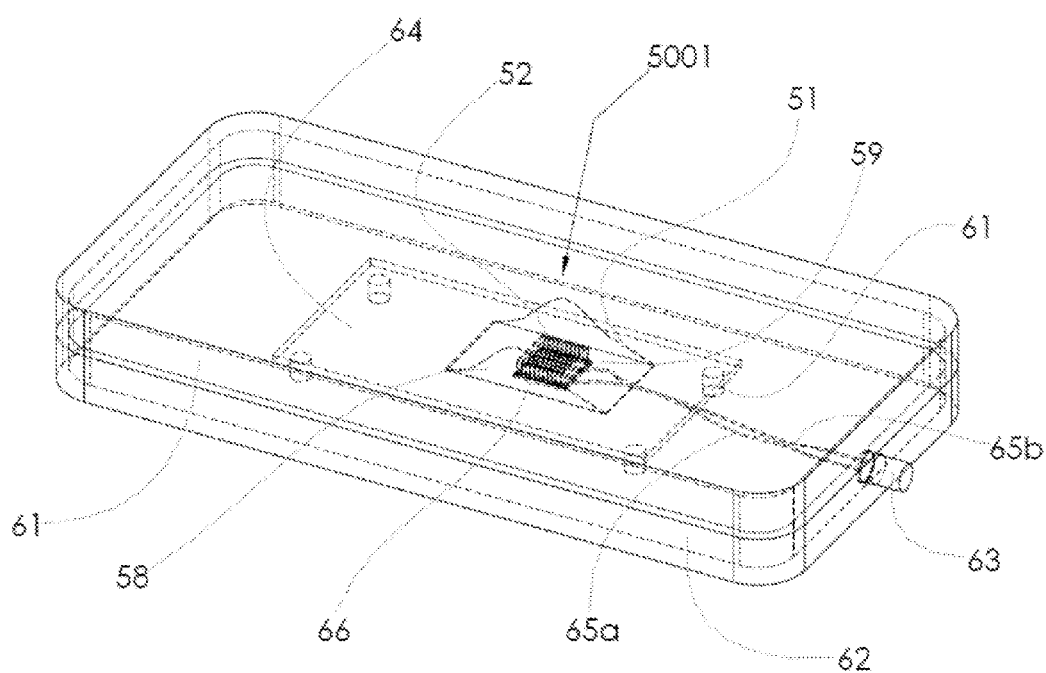
FIG. 18 is a perspective view of a thermal management package in accordance with some embodiments of the present disclosure.

FIG. 18 illustrates an apparatus in accordance with some embodiments of the present disclosure. The apparatus includes a main unit, the thermal management unit 5001, and an enclosure that encloses the main unit and the thermal management unit 5001 therein. The main unit includes a substrate 64 (e.g., a PCB or PCB assembly) and at least one heat source 66 (e.g., IC chip(s) and/or batty/batteries) disposed on the substrate 64. The thermal management unit 5001 include a silicon heat sink 52, a phase-change material 58, and a container 51. The silicon heat sink 52 is disposed on, attached to, bonded to, or otherwise coupled to the at least one heat source 66 and includes a base portion and a fin portion. The fin portion of the silicon heat sink 52 includes a plurality of fins protruding from the base portion. The phase-change material 58 is in direct contact with at least the fin portion of the silicon heat sink 52 and configured to absorb at least a portion of heat that is generated by the at least one heat source 66 and transferred through the silicon heat sink 52. The container 51 is sealed, bonded, or otherwise coupled to the silicon heat sink 52 and configured to contain the phase-change material 58 therein. The container 51 includes a fill hole 59 through which the phase-change material 58 is filled into the container 51.

The enclosure includes a first casing 61 and a second casing 62 that, when coupled together, enclose the main unit and the thermal management unit 5001 in the enclosure. The main unit may be secured to, affixed on, mounted on or otherwise disposed on second casing 62 via one or more mechanical components. The at least one heat source 66 may be coupled to a power button 63 via wirings 65*a* and 65*b* of positive and negative electrical polarities such that the apparatus may be activated and deactivated by a user operating the power button 63.

In some embodiments, the phase-change material 58 may include a salt hydrate, an ionic liquid, paraffin, fatty acid, ester, an organic-organic compound, an organic-inorganic compound, or an inorganic-inorganic compound.

In some embodiments, the silicon heat sink 52 may be made of single-crystal silicon.

In some embodiments, the container 51 may be expandable and configured to expand as at least a portion of the phase-change material 58 changes from a first phase (e.g., amorphous or solid state) to a second phase (e.g., liquid state) in response to absorbing the heat generated by the at least one heat source 66.

In some embodiments, the container 51 may include a pouch having an opening such that, when the container 51 is coupled to the silicon heat sink 52, at least a portion 601 of the base portion of the silicon heat sink 52 is exposed. The exposed portion 601 of the silicon heat sink 52 may be in direct contact with the at least one heat source 66.

In some embodiments, the pouch may be coupled to the silicon heat sink 52 by heat and pressure, solder, pressure-sensitive adhesive, or epoxy.

In some embodiments, the container 51 may include a pouch that includes a metallic foil.

In some embodiments, the container 51 may include a pouch that includes an aluminum foil having surface areas coated with BoPET, also known as Mylar.

In some embodiments, at least a portion of the enclosure may be made of metal or plastic.

In some embodiments, the substrate 64 may include a PCB, and the at least one heat source 66 may include a processor chip.

In some embodiments, the enclosure may include a first primary side and a second primary side. The first primary side of the enclosure may include an interface unit coupled to the processor chip and configured to display information to a user or function as an I/O interface that provides information to the user and receives input from the user.

In some embodiments, at least a layer of the interface unit may be made of glass or sapphire.

Figure 19:
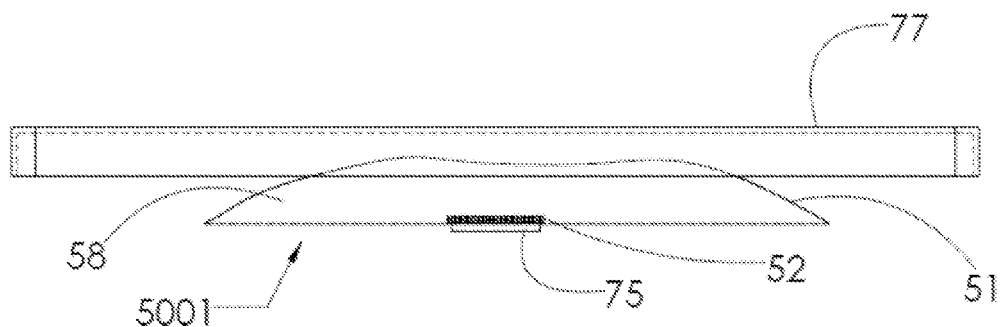
FIG. 19 is a cross-sectional view of a thermal management unit of a thermal management package when the thermal management unit is in a first state in accordance with some embodiments of the present disclosure.
Figure 20:
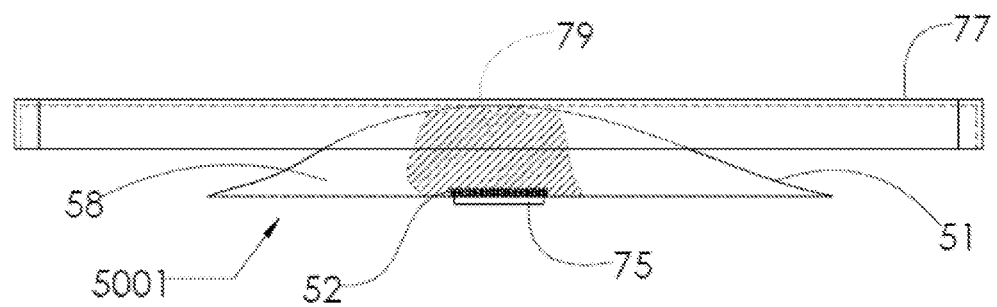
FIG. 20 is a cross-sectional view of a thermal management unit of a thermal management package when the thermal management unit is in a second state in accordance with some embodiments of the present disclosure.

FIG. 19 illustrates the thermal management unit 5001 in a first state in accordance with some embodiments of the present disclosure. FIG. 20 illustrates the thermal management unit 5001 in a second state in accordance with some embodiments of the present disclosure. Referring to FIG. 19, the container 51 is not in direct contact with a first casing 77 of the enclosure when the phase-change material 58 is in the first phase. As shown in FIG. 20, the container 51 may expand to be in direct contact with the first casing 77 of the enclosure when at least a portion of the phase-change material 58 is in the second phase. For example, after the portion 79 of the phase-change material 58 surrounding the fin portion of the silicon heat sink 52 has absorbed a certain amount of heat from the heat source 75 through the silicon heat sink 52, the portion 79 of the phase-change material 58 melts into the liquid phase. This results in the expansion in volume of the phase-change material 58, exerting a force on the container 51 to cause the container 51 to expand. The phase-change material 58 may expand to a point where the container 51 expands to come in contact with the first casing 77 of the enclosure. When the container 51 is in contact with the first casing 77 of the enclosure, more pressure is exerted on the aluminum foil with plastic layers of the container 51 by the phase-change material 58 as its volume increases due to the scope of the portion 79 of the phase-change material 58 that melts increases. This would further enhance heat transfer, e.g., via conduction, from the thermal management unit to the enclosure, e.g., from the phase-change material 58 to the container 51 to the first casing 77 of the enclosure.

Figure 21:
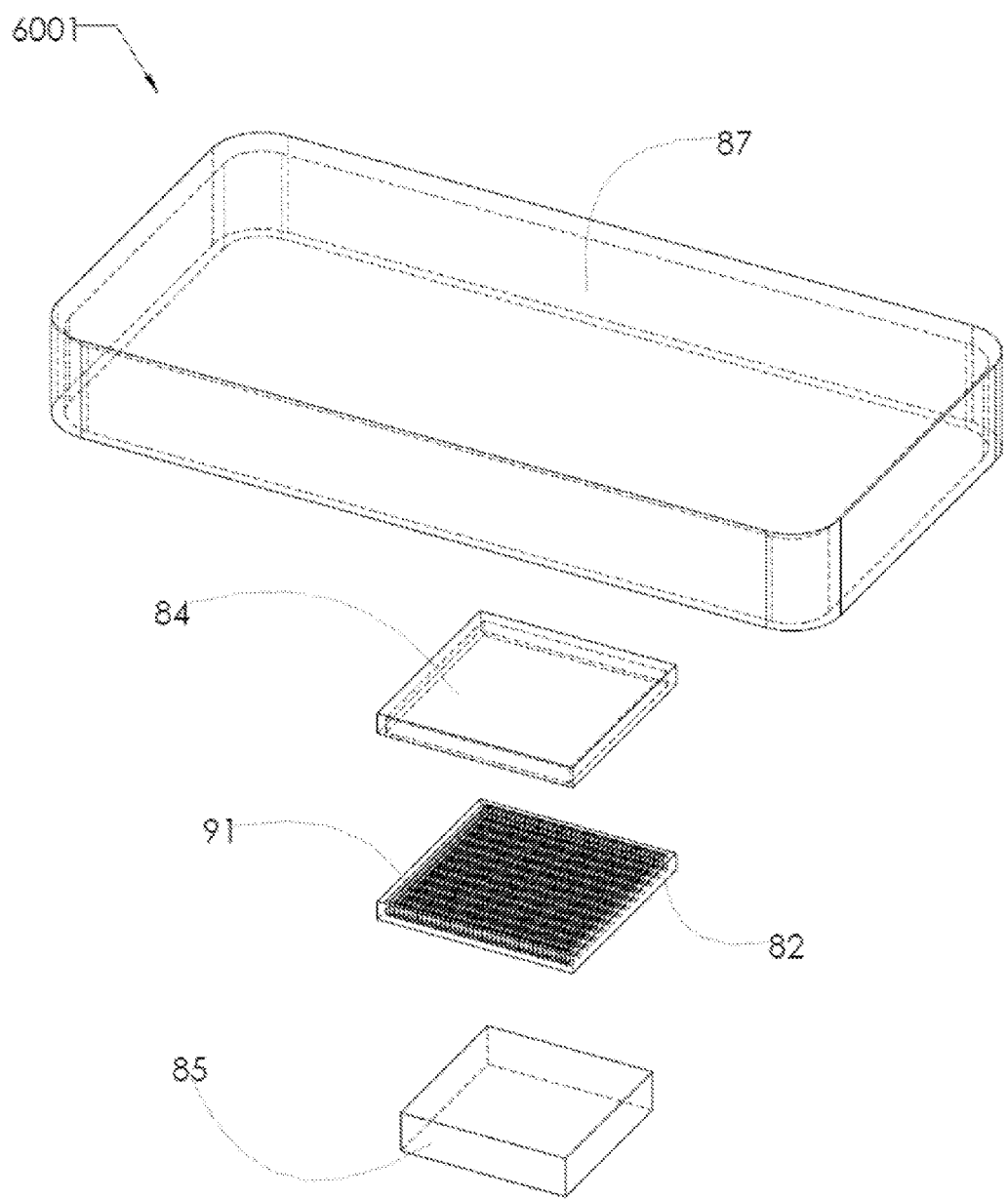
FIG. 21 is an exploded view of a thermal management unit of a thermal management package in accordance with some embodiments of the present disclosure.
Figure 22:
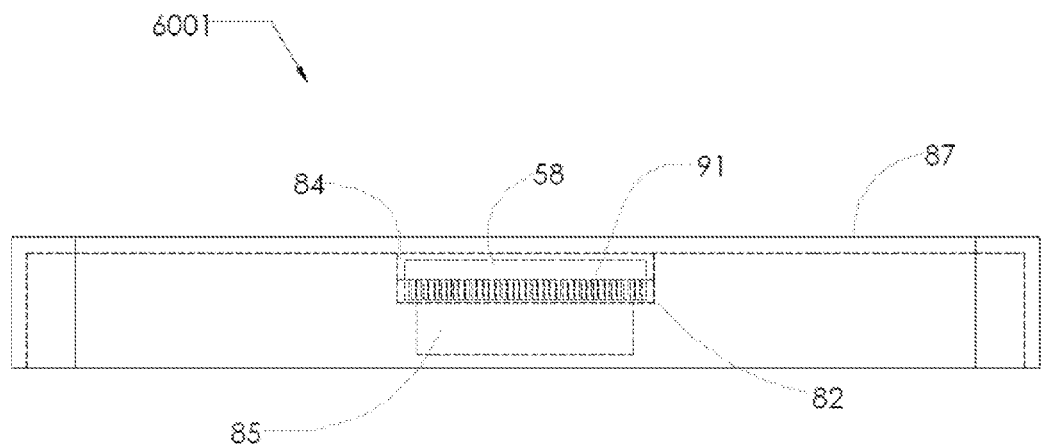
FIG. 22 is a cross-sectional view of the thermal management unit of FIG. 21.

FIG. 21 illustrates a thermal management unit 6001 of an apparatus in accordance with some embodiments of the present disclosure. FIG. 22 is a cross-sectional view of the thermal management unit 6001. Referring to FIGS. 21 and 22, the thermal management unit 6001 includes a container 84, a silicon heat sink 82, and a phase-change material 58. The silicon heat sink 82 includes a base portion and a fin portion 91. The fin portion 91 includes a plurality of fins protruding from the base portion. The silicon heat sink 82 is disposed on, attached to, bonded to, or otherwise coupled to a heat source 85, e.g., an IC chip or a battery.

In some embodiments, the silicon heat sink 82 may further include walls around a periphery of the base portion such that the fin portion 91 is surrounded by the walls.

In some embodiments, the container 84 may include a silicon cover disposed on the silicon heat sink 82. The silicon cover of the container 84 may have a first primary side and a second primary side with the first primary side including an indentation and facing the silicon heat sink 82 when disposed thereon.

In some embodiments, the silicon cover of the container 84 may be made of single-crystal silicon.

In some embodiments, the silicon cover of the container 84 may be disposed between the silicon heat sink 82 and a first casing 87 of the enclosure and may be in direct contact with the first casing 87 of the enclosure.

In some embodiments, the phase-change material 58 may be contained within a space between the silicon cover of the container 84 and the silicon heat sink 82.

Figure 23:
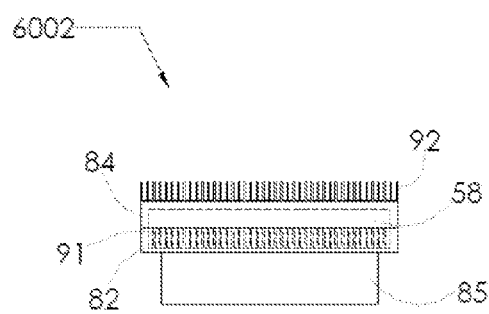
FIG. 23 is an exploded view of a thermal management unit of a thermal management package in accordance with some other embodiments of the present disclosure.

FIG. 23 illustrates a thermal management unit 6002 of an apparatus in accordance with some other embodiments of the present disclosure. Referring to FIG. 23, the thermal management unit 6002 is similar to the thermal management 6001. In the interest of brevity, description of the components of the thermal management unit 6002 similar to corresponding ones of the thermal management unit 6001 will not be repeated. The thermal management unit 6002 differs from the thermal management unit 6001 in that the thermal management unit 6002 is in direct contact with an additional heat sink 92. For example, the additional heat sink 92 may be disposed on the second primary side of the silicon cover of the container 84. Instead of transferring heat to the first casing 87 of the enclosure as in the case of the thermal management unit 6001, in the thermal management unit 6002 heat generated by the heat source 85 is transferred to the additional heat sink 92 through the thermal management unit 6002.

In some embodiments, the additional heat sink 92 may be a silicon heat sink which may be made of, for example, single-crystal silicon.

Figure 24:
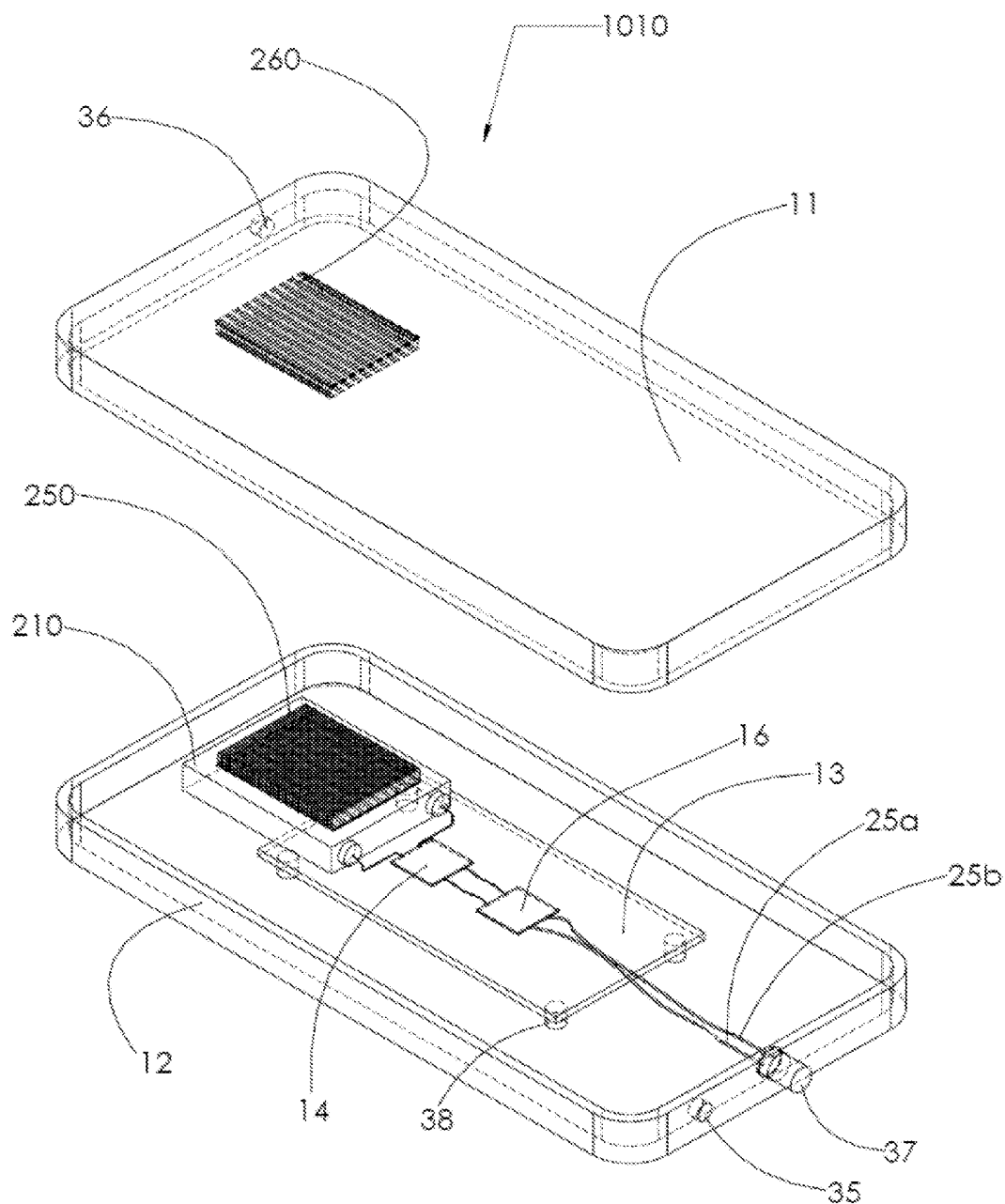
FIG. 24 is an exploded view of certain components of an apparatus in accordance with some embodiments of the present disclosure.
Figure 25:
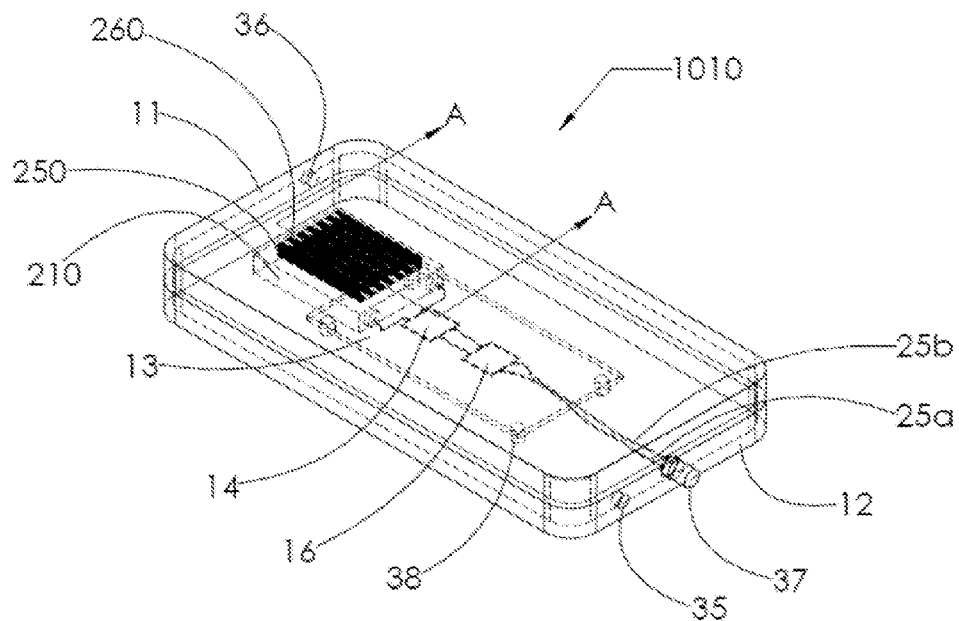
FIG. 25 is a perspective view of the thermal management package of FIG. 24 in accordance with some embodiments of the present disclosure.
Figure 26:
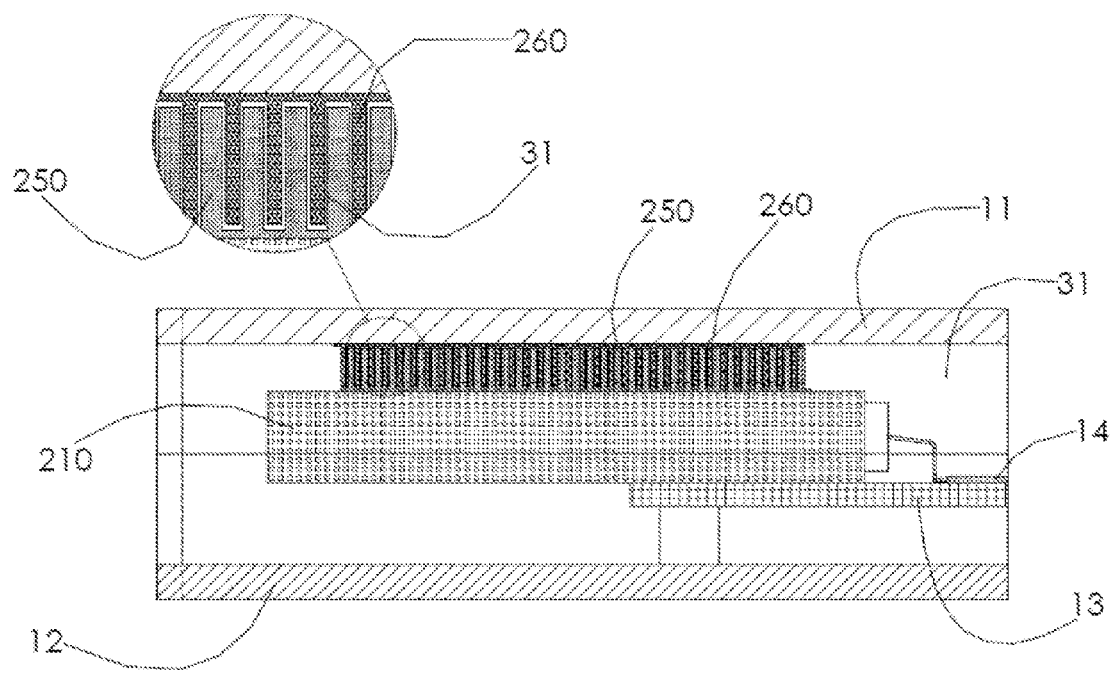
FIG. 26 is a cross-sectional view of the thermal management package of FIG. 24 in accordance with some embodiments of the present disclosure.

FIGS. 24-26 illustrate an apparatus 1010 in accordance with some embodiments of the present disclosure. Referring to FIGS. 24-26, apparatus 1010, which may be seen as a thermal management package, may include a main unit, a phase-change material 31, and an enclosure that encloses the main unit and the phase-change material 31 therein. In particular, FIG. 24 illustrates the apparatus 1010 during assembly, before the phase-change material 31 is filled in the enclosure, and FIGS. 25 and 26 illustrate the apparatus 1010 during operation with the phase-change material 31 filled in the enclosure. As certain components of apparatus 1010 contain may be similar or identical to corresponding components of apparatus 1001, in the interest of brevity description of apparatus 1010 below is focused on differences between apparatus 1010 and apparatus 1001.

Different from apparatus 1001, apparatus 1010 may additionally include a heat-generating device 210 which may be, for example, a battery or an electronic module (e.g., automobile computing system, RF driving module or sensor(s) such as lasers). Apparatus 1010 may also include a silicon heat sink 250 attached to heat-generating device 210. Apparatus 1010 may further include another silicon heat sink 260 attached to casing 11. When apparatus 1010 is packaged, heat-generating device 210 (e.g., battery) may transfer heat to silicon heat sink 250 which may in turn transfer at least part of that heat (from heat-generating device 210) to silicon heat sink 260. Silicon heat sinks 250 and 260 may be configured with protrusions and/or physical features such that silicon heat sinks 250 and 260 are interlaced with each other to maximize the contact surface area between them to optimize heat transfer therebetween. Phase-change material 31 may be filled between gap(s) of the interlaced region between silicon heat sink 250 and silicon heat sink 260. First casing 11 may be easily dissembled from second casing 12. In alternative implementations, a thin film or thermal interface material (TIM) may be placed between heat-generating device 210 and first casing 11 to provide thermal contact therebetween.

Phase-change material 31 will hold or otherwise absorb heat from heat-generating devices in apparatus 1010 and slowly dissipate at least part of the absorbed heat into at least first casing 11. Advantageously, when heat-generating device 210 is a battery, phase-change material 31 will provide heat latency function and stabilize battery chemistry.

Figure 27:
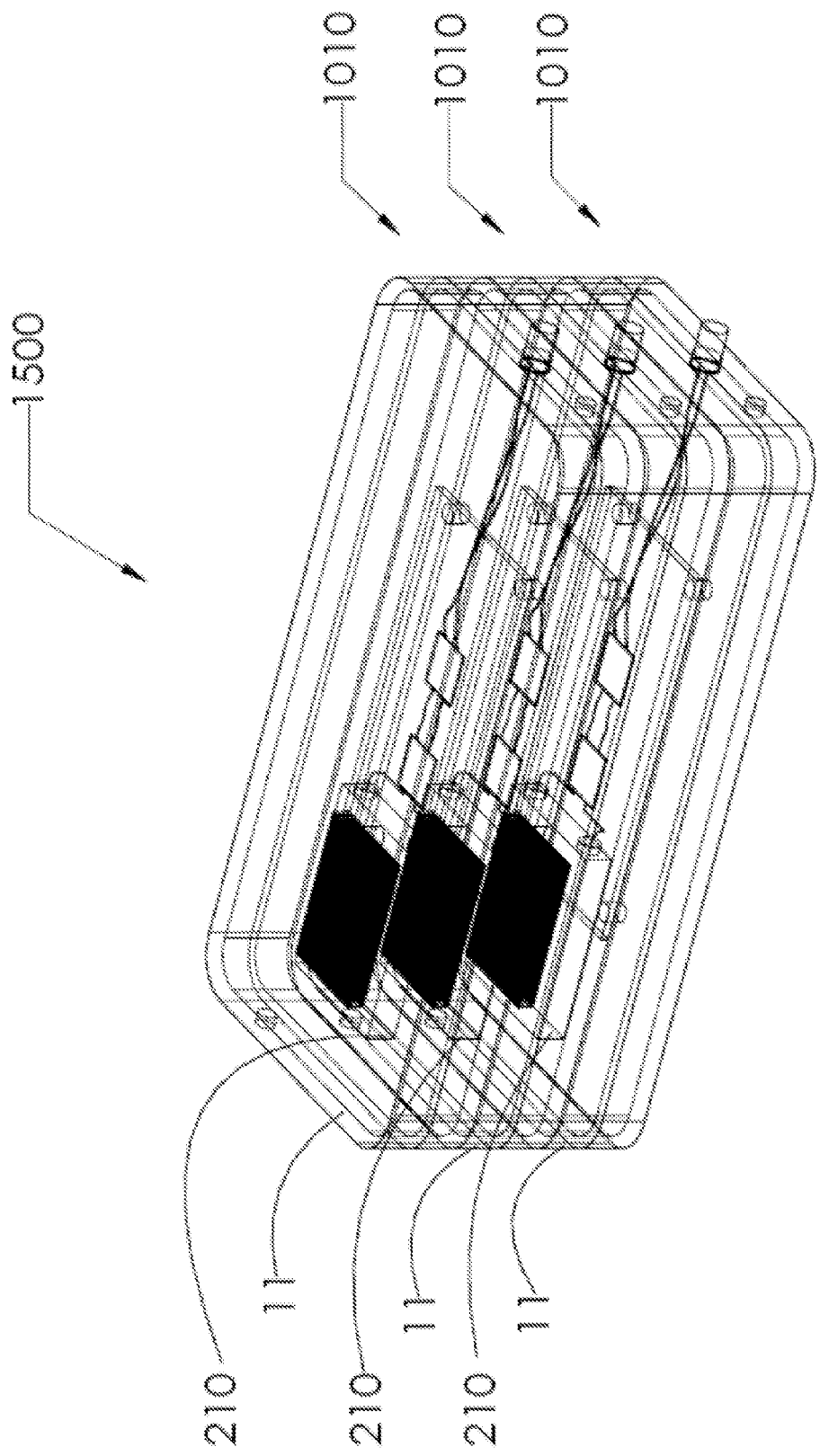
FIG. 27 is a perspective view of a module with multiple units of thermal management package of FIG. 24 stacked together in accordance with some embodiments of the present disclosure.

FIG. 27 illustrates a module 1500 with multiple units of apparatus 1010 stacked together in accordance with some embodiments of the present disclosure. Referring to FIG. 27, module 1500 includes multiple ones of apparatus 1010 stacked together. One example application of module 1500 may be a modular battery system, e.g., for electric vehicles. Each apparatus 1010 may be a battery module and stackable for enhanced capacity. This design is one way to stabilize thermal overload for batteries. Alternatively, each apparatus 1010 may be a computer module, electronics module or sensor module used in a vehicle. Each apparatus 1010 may have its own thermal management system and may be plugged in and out. Unlike desktop computers or rack-mounted computers, electric vehicles in the future may have high ambient temperature inside the vehicle and, accordingly, a module such as apparatus 1010 may need to be equipped to provide its own thermal management.

ADDITIONAL NOTES AND CONCLUSION

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus, comprising:
    a main unit, comprising:
        a substrate, and
        at least one heat-generating device disposed on the substrate;
    a thermal management unit, comprising:
        a first silicon heat sink coupled to the at least one heat-generating device and comprising a base portion and a fin portion, the fin portion of the first silicon heat sink comprising a plurality of fins protruding from the base portion,
        a second silicon heat sink comprising a base portion and a fin portion, the fin portion of the second silicon heat sink comprising a plurality of fins protruding from the base portion, and
        a phase-change material in direct contact with at least the fin portion of the first silicon heat sink and configured to absorb at least a portion of heat that is generated by the at least one heat-generating device and transferred through the first silicon heat sink; and
    an enclosure enclosing the main unit and the thermal management unit therein, the second silicon heat sink coupled to the enclosure.

2. The apparatus of claim 1, wherein the phase-change material comprises a salt hydrate, an ionic liquid, paraffin, fatty acid, ester, an organic-organic compound, an organic-inorganic compound, or an inorganic-inorganic compound.

3. The apparatus of claim 1, wherein each of the first silicon heat sink and the second silicon heat sink is made of single-crystal silicon.

4. The apparatus of claim 1, wherein the first silicon heat sink further comprises walls around a periphery of the base portion such that the fin portion is surrounded by the walls.

5. The apparatus of claim 1, wherein at least a portion of the enclosure is made of metal or plastic.

6. The apparatus of claim 1, wherein the at least one heat-generating device comprises a battery, an integrated-circuit (IC) chip, or a combination thereof.

7. An apparatus, comprising:
    a main unit, comprising:
        a substrate, and
        at least one heat-generating device disposed on the substrate;
    a phase-change material in direct contact with each heat-generating device of the at least one heat-generating device and configured to absorb at least a portion of heat generated by the at least one heat-generating device during operation of the at least one heat-generating device; and
    an enclosure enclosing the main unit and the phase-change material therein.

8. The apparatus of claim 7, wherein the phase-change material surrounds the at least one heat-generating device and is in direct contact with the at least one heat-generating device and the enclosure.

9. The apparatus of claim 8, wherein the phase-change material substantially fills a void between the main unit and the enclosure.

10. The apparatus of claim 7, wherein the phase-change material comprises a salt hydrate, an ionic liquid, paraffin, fatty acid, ester, an organic-organic compound, an organic-inorganic compound, or an inorganic-inorganic compound.

11. The apparatus of claim 7, further comprising:
    at least one silicon heat sink, wherein:
        each silicon heat sink of the at least one silicon heat sink comprises a base portion and a fin portion, and
        the fin portion comprises a plurality of fins protruding from the base portion.

12. The apparatus of claim 11, wherein the at least one silicon heat sink comprises one or more heat sinks made of single-crystal silicon.

13. The apparatus of claim 11, wherein the at least one silicon heat sink comprises a first silicon heat sink corresponding to and disposed on a first heat-generating device of the at least one heat-generating device.

14. The apparatus of claim 13, wherein the at least one silicon heat sink further comprises at least one additional silicon heat sink disposed on the enclosure.

15. The apparatus of claim 14, wherein the at least one additional silicon heat sink is disposed on an inner side of the enclosure facing a side of the substrate on which the at least one heat-generating device is disposed, and wherein the fins of the first silicon heat sink protrude from the base portion thereof in a first direction and the fins of the at least one additional silicon heat sink protrude from the base portion thereof in a second direction opposite to the first direction.

16. The apparatus of claim 15, wherein the at least one additional silicon heat sink is aligned with the first silicon heat sink.

17. The apparatus of claim 16, wherein at least one of the fins of the first silicon heat sink is disposed between respective two adjacent fins of the at least one additional silicon heat sink, and wherein at least one of the fins of the at least one additional silicon heat sink is disposed between respective two adjacent fins of the first silicon heat sink.

18. The apparatus of claim 7, wherein at least a portion of the enclosure is made of metal or plastic.

19. The apparatus of claim 7, wherein the at least one heat-generating device comprises a battery, an integrated-circuit (IC) chip, or a combination thereof.

* * * * *